United States Patent [19]
Imai et al.

[11] Patent Number: 5,602,418
[45] Date of Patent: Feb. 11, 1997

[54] NITRIDE BASED SEMICONDUCTOR DEVICE AND MANUFACTURE THEREOF

[75] Inventors: Hideaki Imai, Fuji; Kunio Miyata, Kyoto; Tadahiko Hirai, Koganei, all of Japan

[73] Assignee: Asahi Kasei Kogyo Kabushiki Kaisha, Osaka, Japan

[21] Appl. No.: 211,322

[22] PCT Filed: Aug. 7, 1992

[86] PCT No.: PCT/JP92/01016

§ 371 Date: Sep. 22, 1994

§ 102(e) Date: Sep. 22, 1994

[87] PCT Pub. No.: WO94/03931

PCT Pub. Date: Feb. 17, 1994

[51] Int. Cl.[6] .......................... H01L 27/15; H01L 33/00; H01L 29/04

[52] U.S. Cl. ................ 257/627; 257/82; 257/85; 257/90; 257/96

[58] Field of Search ................ 257/627, 82, 85, 257/89, 90, 96, 184, 189; 437/16, 23, 105, 127, 129, 132, 133; 372/7, 42, 43

[56] References Cited

U.S. PATENT DOCUMENTS

| | | |
|---|---|---|
| 4,404,265 | 9/1983 | Manasevit . |
| 5,247,533 | 9/1993 | Okazaki et al. ............... 257/13 |
| 5,389,571 | 2/1995 | Takeuchi et al. .............. 437/133 |

FOREIGN PATENT DOCUMENTS

0483688A2  5/1992  European Pat. Off. .

OTHER PUBLICATIONS

"InGaN lattice matching growth onto a ZnO substrate", Yoshimoto et al., Preparatory Reports of the 38th Appl. Phys. related Combined Lecture No. 1 pp. 339, 31p–ZK–13, Mar. 28, 1991.

"High–Power GaN P–N Junction Blue–Light–Emitting Diodes", Nakamura et al., Japanese Journal of Applied Physics, vol. 30, No. 12A, pp. L1998–L2001, Dec. 1991.

"Growth of GaN(0001) 1x1 on $Al_2O_3$(0001) by gas–source molecular beam epitaxy", Powell et al., Appl. Phys. Lett., vol. 60, No. 20, pp. 2505–2507, May 1992.

Primary Examiner—Wael Fahmy
Assistant Examiner—Fetsum Abraham
Attorney, Agent, or Firm—Finnegan, Henderson, Farabow, Garrett & Dunner, L.L.P.

[57] ABSTRACT

A nitride semiconductor device is made using a molecular beam epitaxy growth apparatus having a gas source for supplying a compound including gaseous nitrogen, solid body sources for supplying Group III constituents, and sources for supplying n-type and p-type dopants. A gaseous state compound containing nitrogen, and a Group III constituent is supplied to the surface of a substrate, wherein the substrate is at a temperature of 300° to 1000° C. and is under a pressure of less than $10^{-5}$ Torr, to produce a first layer of oriented polycrystalline nitride semiconductor on the substrate at a growth rate of 0.1 to 20 Angstroms/second. Subsequently, a gaseous state compound containing nitrogen and a Group III constituent is supplied to the surface of the first layer of the substrate to produce a single crystal nitride semiconductor layer on the first layer at a growth rate of 0.1 to 10 Angstroms/second. The resultant nitride semiconductor device comprises a substrate, a first layer of an oriented polycrystalline nitride semiconductor of less than 5000 Angstroms thickness and disposed directly on the substrate, an operating layer of a single crystal nitride semiconductor disposed directly on the first layer, and at least two electrical terminals connected at predetermined locations, with at least one terminal being connected to the first layer.

24 Claims, 8 Drawing Sheets

NITRIDE BASED SEMICONDUCTOR DEVICE AND MANUFACTURE THEREOF

TECHNICAL FIELD

The present invention relates to nitride semiconductor device. In particular the present invention relates to nitride semiconductor device which can be used for light emitting diodes and laser diodes which emit light in the region from ultra violet to orange, and are suitable as light sources for display, light transmission and office automation equipment.

BACKGROUND ART

Semiconductor devices, in particular visible light, light emitting diodes (LED) are used extensively for display devices and for various light sources. However, they have not yet been used as light emitting diodes in the ultra violet to blue light region. There has however been rapid development of light emitting diodes for use in displays requiring three basic colors. The expected ten fold increase in recording density by using laser diodes as a light source for optical disks and compact disks however has not yet been achieved. Light emitting diodes and lazer diodes emitting light in the ultra violet to blue color region use compound semiconductors such as GaN, ZnSe, ZnS, and SiC.

However, with these wide band gap compound semiconductors, it is generally difficult to produce single crystal thin films, and methods for manufacturing thin films which can be used for light emitting devices have yet to be established. For example, gallium nitride (GAN) which shows promise as a blue light emitting device, has up until now been grown as a thin film on the sapphire C (0001) face by means of the Metal Organic Chemical Vapor Deposition (MOCVD) method, or the Vapor Phase Epitaxy (VPE) method (Journal of Applied Physics 56 (1984) 2367–2368). With this method however it is necessary to have a high reaction temperature in order to obtain good crystallization. Consequently production is extremely difficult. Furthermore, since growth occurs at a high temperature, defects due to nitrogen deficiency can occur, and carrier density may become extremely large. As a result satisfactory semiconductor characteristics are difficult to obtain. In order to overcome these problems an aluminum nitride buffer layer is formed on the sapphire C (0001) face and a GaN thin film of a comparatively large film thickness is formed on top of this to make up a semiconductor light emitting elements.

In tests to achieve film growth at low temperatures, a method whereby the nitrogen supply gas is activated by irradiating it with an electron shower has been proposed (Japanese Journal of Applied Physics, 20, L545 (1981)). However, even with this method it is not possible to obtain film qualities suitable for light emission. Furthermore, to guard against nitrogen deficiency a highly activated nitrogen source is used in carrying out the film growth. To obtain the highly activated nitrogen a method utilizing plasma is used (Journal of Vacuum Science and Technology, A7, 701 (1989)). However up until now this method has been unsuccessful.

Investigations have also been made with GaInN mixed crystal thin films. Most of the tests involved thin film growth on the sapphire C face using the Metal Organic Vapor Phase Epitaxy (MOVPE) method (Journal of Applied Physics 28 (1989) L-1334). With this method however, the growth temperature for GaN and InN differs markedly making it difficult to obtain a good quality GaInN mixed crystal. Also, with GaAlN mixed crystals, an example of film growth by means of a gas-source molecular beam epitaxy (MBE) method using ammonia gas has been reported (Journal of Applied Physics 53 (1982) 6844–6848). However, with this method, although cathodoluminescence at liquid nitrogen temperatures was observed, a good quality thin film for the manufacture of light emitting devices was not obtained.

When using the conventional MOCVD and MOVPE methods for the manufacture of nitride semiconductor thin films, it is necessary to use a source material which contains carbon. Since the pressure during film growth is high, there are problems with the absorption of significant amounts of carbon impurities into the thin film so that a nitride semiconductor having poor qualities results.

Alternatively, there is a proposed construction wherein a single crystal thin film of Group III–V compound semiconductor including In and/or Ga is grown directly on a single crystal electrically insulating substrate (U.S. Pat. No. 4,404, 265). With this proposal however, the following problems exist. The conditions required for directly growing the Group III–V compound semiconductor single crystal thin film on the substrate are extremely limited. Consequently the fabrication is not easy. Moreover, when growing a thin film of semiconductor directly on the substrate, a significant stress occurs in the semiconductor thin film due to the lattice mismatch between the substrate and the semiconductor, resulting in poor device durability. Furthermore, since the single crystal semiconductor is formed on the substrate, conductivity is reduced making it difficult to form a satisfactory ohmic contact for device operation.

With the nitride semiconductor thin films as described above, the GaAs semiconductor and Si semiconductor are different. Hence, since the semiconductor does not have a single crystal substrate of its own type, the thin film must be grown by the heteroepitaxy method. The production of thin films having good crystallization suitable for semiconductor devices, especially light emitting devices is thus extremely difficult.

SUMMARY OF THE INVENTION

It is an object of the present invention to address the above problems and provide a nitride semiconductor device, in particular a semiconductor light emitting device having good properties in the ultraviolet to orange range.

The present inventor carried out exhaustive research into the above problems. In this research a substrate surface having a periodic atomic spacing in at least one direction was used. An oriented polycrystalline nitride semiconductor with the atomic spacing of the lattice surface thereof close to an integer multiple of that of the substrate was grown directly on the surface of the substrate. It was found that by this procedure a single crystal nitride semiconductor thin film having excellent crystal characteristics in spite of being extremely thin could be grown on the oriented polycrystalline nitride semiconductor. It thus became evident that by following this procedure semiconductor devices having excellent characteristics could be obtained.

The nitride semiconductor device of the present invention, thus comprises a substrate, first layer of an oriented polycrystalline nitride semiconductor of less than 500 Angstroms thickness disposed directly on the substrate, an operating layer of a single crystal nitride semiconductor disposed directly on the first layer, and has at least two electrical terminals connected at predetermined positions, with at least one of the terminals connected to the first layer.

Furthermore, the method of manufacture of the nitride semiconductor device of the present invention uses a molecular beam epitaxy method having a gas source for supplying a compound including nitrogen in a gaseous state, a solid body source for supplying Group III constituents, and a source for supplying n-type and p-type dopants. A gaseous state compound including nitrogen, and a Group III constituent are supplied to the surface of the substrate, with the substrate at a temperature of 300° to 1000° C., under a pressure of less than $10^{-5}$ Torr to produce a first layer of oriented polycrystalline nitride semiconductor on the substrate at a growth rate of 0.1–20 Angstroms/second. Then at a pressure of less than $10^{-5}$ Torr and with the substrate at a temperature of 300+−1000° C., a gaseous state compound containing nitrogen, and a Group III constituent is supplied to the surface of the first layer to produce a single crystal nitride semiconductor layer on the first layer at a growth rate of 0.1–10 Angstroms/second.

With the oriented polycrystalline nitride semiconductor layer, the crystals in the vicinity of the interface between the substrate and the nitride semiconductor are oriented in substantially the same direction, and crystallization of the thin film improves with increasing distance from the interface of the substrate and the nitride semiconductor.

BEST MODE FOR CARRYING OUT THE INVENTION

Figure 1:
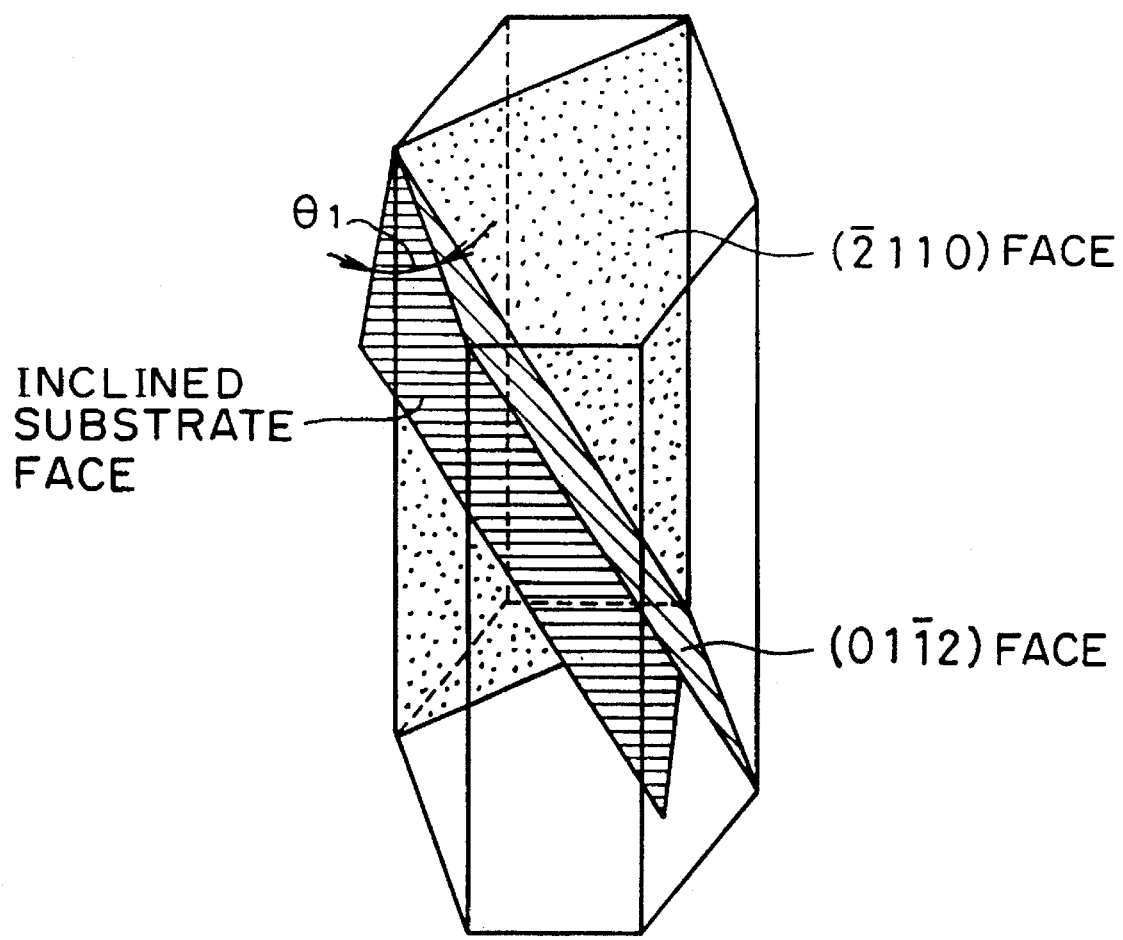
FIG. 1 is a perspective view showing a hexagonal crystal system showing a crystal face inclined at an angle of $\theta 1$ to the $(01\bar{1}2)$ face towards the $(\bar{2}110)$ face.

With the substrate according to the present invention, at least one of the orientations of the periodic arrangement of the atoms on the surface of the substrate, and at least one of the orientations of the crystal axes of the lattice face of the first layer nitride semiconductor in direct contact with the substrate coincide, and the mismatch of an integer multiple (from 1 to 10) of the atomic spacing of the latter orientation and the atomic spacing of the former orientation is preferably within 5%.

The atoms periodically arranged on the surface of the substrate are those atoms which occupy the lattice points of the substrate crystal, and are positioned uppermost on the crystal surface. The integer multiple of the atomic spacing in at least one direction of the lattice face of the nitride of the oriented polycrystalline nitride semiconductor of the first layer is from 1 to 10. If this exceeds 10 the stacking of the atoms exposed on the substrate surface, with the atomic orbits of the nitride semiconductor becomes small so that the crystal orienting function is decreased, making it difficult to obtain a well orientated polycrystalline nitride semiconductor layer. The difference between the integer multiple of the atomic spacing in at least one direction on the lattice face of the nitride of the oriented polycrystalline nitride semiconductor, and the atomic spacing of the periodic arrangement of the atoms on the surface of the substrate in the same direction is preferably within 5%. If the difference (or mismatch) is greater than this, it becomes difficult to obtain a well oriented nitride semiconductor layer. A mismatch value of less than 3% is more preferable, and less than 1% is even more preferable.

With regards to the mismatch between the atomic spacing of the substrate and that of the nitride semiconductor. This refers to the difference in atomic spacing between an atomic spacing (a) (in one direction) of the lattice face of the nitride semiconductor grown on the substrate surface and in contact with the substrate surface, and an atomic spacing (b) (in one direction) of the periodic arrangement of atoms on a specific cut face of the single crystal substrate. The magnitude of the mismatch is represented by $|b-n \times a|/b \times 100(\%)$ where (n=1–10). The atomic spacing can be determined from the respective nitride semiconductor and the single crystal substrate lattice constants. This can be calculated once the substrate cut face has been decided.

Furthermore, it is even more preferable if the atomic spacing mismatch between the integral multiple of the atomic spacing in a second direction of the lattice face of the nitride of the orientated polycrystalline nitride semiconductor of the first layer, and the atomic spacing of the periodic arrangement of atoms on the upper surface of the substrate in the same second direction is also within 5%. In this case, the form of the lattice face of the nitride of the orientated polycrystalline nitride semiconductor is preferably the same as that of the periodic arrangement of the atoms on the substrate surface.

The following substrates may be used in the present invention. Single crystal semiconductor substrates such as Si, Ge, SiC, Group III–V compound semiconductor substrates such as GaAs, InAs, InP, and GaSb, and single crystal substrates such as AlN, ZnO, sapphire ($Al_2O_3$), quartz ($SiO_2$), $TiO_2$, MgO, $MgF_2$, $CaF_2$, and $SrTiO_3$. In order to satisfy the before mentioned conditions, the substrate crystal is grown so that a surface may be inclined at the desired angle to a predetermined reference face or cut and polished after growing the crystal. With the above substrates, the lattice face is often about ±2 degrees out of alignment with the surface so that a complete lattice face generally does not occur on the surface. Although this type of substrate may also be used, it is preferable if a misalignment of not more than ±1 degrees exists and more preferable if this is less than ±0.5 degrees. Furthermore, a single crystal thin film which satisfies the above conditions is grown on generally used glass, polycrystalline substrate or single crystal substrate as a substrate. The required oriented polycrystalline nitride semiconductor can then be grown on top of this. As an example of a single crystal thin film, for GaN, this may be a single crystal silicone substrate on which has been grown ZnO or SiC. There are no particular restrictions on the thickness of the single crystal thin film provided that a uniform surface is obtained.

When required for a light emitting element or light detecting device, it is preferable to use a transparent single crystal substrate having a transmissivity of not less than 80% in the wave length range from 360–800 mm. With this substrate, it is possible for emitted light or detected light to pass through the substrate. Typical examples of transparent single crystal substrates include sapphire, single crystal quartz, MgO, $TiO_2$, $MgF_2$, $CaF_2$, and $SrTiO_3$. Of these however the sapphire substrate is preferable. The C face (0001), R face (01 $\bar{1}$ 2), and A face ($\bar{2}$ 110) of the sapphire may be used as the lattice face, and the required substrate surface may be obtained by inclining at the required angle to these reference faces. For example, if the sapphire R face (01 $\bar{1}$ 2) is used, then with $Ga_{1-x}In_xN$ wherein x is in the range from 0 to 0.45, and $Ga_{1-y}Al_yN$ wherein y is in the range from 0 to 1, the difference in length between 3 times the length of the c-axis of the nitride semiconductor, and the axial length of the R face projection of the sapphire c-axis is within 5%. Consequently this is suitable as a substrate for the present invention. Furthermore, using the face inclined at an angle of 9.2 degrees to the sapphire R face (01 $\bar{1}$ 2) towards the A face ($\bar{2}$ 110), as a substrate face is even more preferable, since in this case, 3 times the length of the c-axis of the nitride semiconductor and 4 times the length of the line of intersection of the A face and C face of the nitride semiconductor are both within 5% of the periodic atomic spacing on the face inclined at 9.2 to the sapphire R face (01 $\bar{1}$ 2) towards the A face ($\bar{2}$ 110).

There are no particular limits to the thickness of the substrate of the present invention. However, when used as a light emitting device with light passing through the substrate, the thickness should preferably be as thin as possible. In practice, mechanical strength is the necessary consideration both in the manufacture of the nitride semiconductor thin film and in the manufacture of the subsequent device. Consequently a substrate thickness of from 0.05–2.0 mm is preferable. If this is less than 0.05 mm, mechanical strength is low making handling difficult. If the thickness is above 2.0 mm, then it becomes difficult to cut up the substrate for use as devices, and when used for light emitting devices, the light extraction efficiency is reduced.

A feature of the present invention is that the nitride semiconductor layer grown directly on the substrate is an orientated polycrystalline nitride semiconductor layer having a thickness of not more than 5000 angstroms. With the orientated polycrystalline nitride semiconductor layer in direct contact with the substrate, at least one of the orientations of the periodic arrangement of atoms on the surface of the substrate, coincide with at least one of the orientations of the crystal axis of the lattice face of the first layer nitride semiconductor layer in direct contact with the substrate. Furthermore the mismatch of an integer multiple (from 1 to 10) of the atomic spacing of the latter orientation, and the atomic spacing of the former orientation is within 5%. Consequently even in a region close to the substrate and the nitride semiconductor interface, the crystal grows two dimensionally, and aligns itself in a direction for minimum mismatch. Moreover, crystallinity of the thin film improves with increasing distance from the substrate surface. Hence, with the orientated polycrystalline nitride semiconductor layer of the present invention, the crystal of the nitride semiconductor may be aligned parallel with the substrate surface, so that a smooth surface is possible. Consequently an operating layer having good characteristics may be grown on top of this layer. This phenomena wherein orientation is improved may be observed during semiconductor thin film growth by Refractive High Energy Electron Diffraction (RHEED) techniques. It may also be observed after growth of the thin film by transmission electron microscope or X-ray diffraction methods. Although the thickness of the oriented polycrystalline nitride semiconductor layer is less than 5000 angstroms, this depends on the film growth rate and degree of mismatch. When the film growth rate or mismatch are large, a thick orientated polycrystalline nitride semiconductor film is not obtained and the single crystal nitride semiconductor tends to grow with a rough surface. When the oriented polycrystalline nitride semiconductor layer is made using the Molecular Beam Epitaxy (MBE) method according to the present invention, a thickness of less than 5000 angstroms gives adequate device characteristics. If the thickness of the thin film is greater than this, the growth time of the thin film becomes excessive so as to be unpractical. For example with a thin film growth rate of several angstroms per second, and a mismatch in one direction of approximately 1%, then even with a thickness of 500–1000 angstroms, it is not possible to obtain a well crystallized oriented polycrystalline nitride semiconductor layer having a smooth surface. However, when the mismatch in a second direction is also less than 1%, it is possible to obtain a well crystallized oriented polycrystalline nitride semiconductor layer with a smooth surface even if the film thickness is only several tens of angstroms thick. Accordingly, the film thickness of the oriented polycrystalline nitride semiconductor layer should preferably be within the range of from 10–5000 angstroms.

The oriented polycrystalline nitride semiconductor layer of the present invention may comprise nitrogen and at least one Group III constituent selected from Al, Ga, or In.

For example, when oriented polycrystalline nitride semiconductor having Ga as the main constituent is grown on a sapphire substrate, the resultant structure is such that the direction of the c-axis of the nitride semiconductor on the sapphire R face is aligned with the axial direction of the projection of the sapphire c-axis on the R face. The thickness of the layer depends on the film growth rate and is normally from 300–2500 angstroms. Moreover, when the face inclined at an angle of 9.2 ($\theta$1) degrees to the sapphire R face (01$\bar{1}$2) towards the A face ($\bar{2}$110) is used as a substrate face, an extremely thin film of oriented polycrystalline nitride semiconductor of less than several tens of angstroms thickness is obtained having a uniform surface and good crystallization.

With the present invention, in a second aspect of the oriented polycrystalline nitride semiconductor in direct contact with the substrate surface, the nitride semiconductor composition is given a composition graded structure with the structure changing gradually from the substrate side to finally give a required operating layer composition. The composition graded structure involves growing a semiconductor thin film comprising $Ga_{1-x-y}In_xAl_yN$ ($0 \leq x \leq 1$, $0 \leq y \leq 1$) on the substrate so as to give the finally required operating layer structure. With the $Ga_{1-x-y}In_xAl_yN$ ($0 \leq x \leq 1$, $0 \leq y \leq 1$) composition the x and/or y value may change gradually from the substrate side. This change may be determined by consideration of the required operating layer properties, and may involve changing the composition to increase the lattice constant, or changing the composition to decrease the lattice constant. By means of this composition graded structure, the stress applied to the operating layer may be minimized even in cases where defects exist in the crystal. Consequently device characteristics and durability may be improved.

In a third aspect of the oriented polycrystalline nitride semiconductor in direct contact with the substrate surface, a plurality of oriented polycrystalline nitride semiconductor layers having a composition different from that of the nitride semiconductor and a thickness of less than 100 angstroms are arranged in alternately stacked layers. With this laminated construction, the characteristics and durability of the device may be improved. In this case the effectiveness is reduced if the thickness of the respective layers is too thick. Consequently the thickness should be less than 100 angstroms, preferably less than 70 angstroms and more preferably less than 50 angstroms. Moreover, the thickness of the oriented polycrystalline nitride semiconductor layer should be not less than 10 angstroms. If less than this, the beneficial effect on device characteristics and durability does not appear.

The flatness of the surface of the oriented polycrystalline nitride semiconductor obtained in this way has an unevenness of less than 100 angstroms. With this surface it thus possible to grow a second layer having good crystallization. This amount of unevenness can be measured by means of an atomic force microscope.

With the present invention, the oriented polycrystalline nitride semiconductor layer formed in direct contact with the substrate surface has good electrical conductivity. Hence a uniform electric field may be applied over the entire operating layer by appropriate connection to terminals for operation of the device. Furthermore, to improve on the functions, n-type or p-type doping may be performed. In particular, n-type doping is preferable. For the n-type doping, dopants such as Si, Ge, C, Sn, Se, Te and the like may be used. By variation of the type and amount of dopant used, carrier density may be controlled, and electrical resistance reduced.

The carrier density should be not less than $10^{17}$ cm$^{-3}$, and preferably not less than $10^{18}$ cm$^{-3}$.

The single crystal nitride semiconductor according to the present invention, may comprise a constituent containing nitrogen and at least one Group III constituent selected from Al, Ga or In. The band gap of these constituents lies within the broad range of from 2.4 eV for InN, 3.4 eV for GaN, to 6.2 eV for AlN. Band gap control may be achieved by making a mixed crystal semiconductor thin film comprising Al, Ga, or In. For example, this may comprise AlGaN, GaInN, or AlGaInN. Furthermore, band gap control may be achieved by doping the semiconductor or mixed crystal semiconductor with a p-type or n-type dopant.

With the present invention, the operating layer of single crystal nitride semiconductor formed on the substrate may comprise one or two groups of single crystal nitride semiconductor layer having at least one n-type, i-type or p-type single crystal nitride semiconductor layer, depending upon the purpose of the device. The n-type dopant may be, Si, Ge, C, Sn, Se, Te and the like, while the p-type dopant or i-type dopant may be Mg, Ca, Sr, Zn, Be, Cd, Hg, or Li and the like. By changing the type of dopant and the amount used, the required conductivity type and carrier density may be obtained. Moreover a structure may be made with a variation in doping concentration in the direction of the film thickness, and a structure with a $\delta$ doping layer with doping only in a specific layer may also be obtained.

The oriented polycrystalline nitride semiconductor according to the present invention is able to distinguish from the single crystal nitride semiconductor and the polycrystalline nitride semiconductor by using a multiple axis X-ray diffraction, or a transmission electron microscope method, or an electron beam diffraction method.

The nitride semiconductor devices may be for example; field effect transistors wherein the majority-carrier flow in the n-type or p-type nitride semiconductor layer is controlled by applying a voltage to the gate, bi-polar transistors having an n-p-n-type or p-n-p-type nitride semiconductor layer structure, light emitting devices having a structure comprising at least one n-type, p-type or i-type nitride semiconductor layer, light detecting devices with a structure comprising an n-type/p-type/i-type nitride semiconductor layer, rectifying devices with a structure comprising a p$^+$-type/n-type/n$^+$-type nitride semiconductor layer, light emitting devices or electronic elements with a structure combining n-type and/or p-type with a quantum well structure. However the nitride compound semiconductor devices of the present invention are not limited to those of the above.

FIGS. 2 to 13 show examples of structures of operating layers for use as a light emitting devices.

Figure 2:
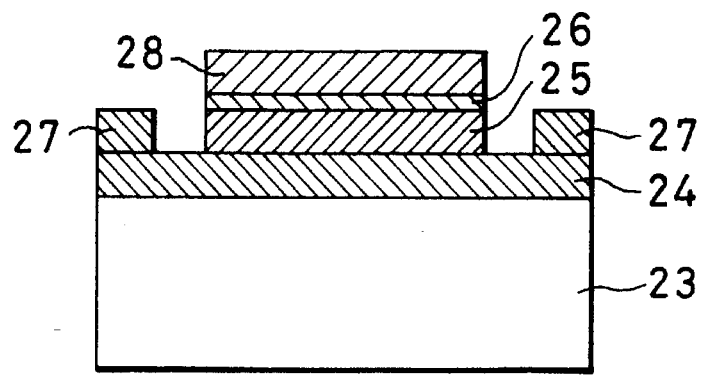
FIG. 2 is a sectional structural view showing a light emitting device according to a first working example comprising oriented polycrystalline GaN/n-GaN/p-GaN.

With the structure of the operating layer shown in FIG. 2, a single crystal (n-GaN) 25/single crystal (p-GaN) 26 is formed on an oriented polycrystalline (GAN) 24 which is formed on the substrate 23. With this device, a terminal 27 is connected to the oriented polycrystalline (GAN) 24, and a terminal 28 is formed on the operating layer 26.

Figure 3:
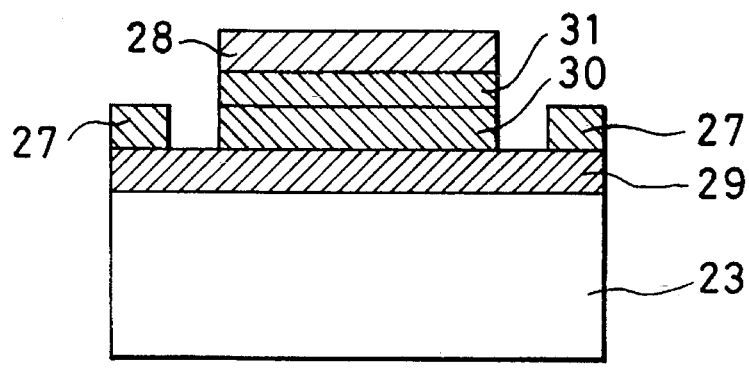
FIG. 3 is a sectional structural view showing a light emitting device comprising oriented polycrystalline $Ga_{1-n}In_xN/n-Ga_{1-n}In_xN/p-Ga_{1-n}In_xN$.

With the structure of the operating layer shown in FIG. 3, a single crystal (n-$Ga_{1-x}In_xN$) 30/single crystal (p-$Ga_{1-x}In_xN$) 31 is formed on an oriented polycrystalline ($Ga_{1-x}In_xN$) 29 which is formed on the substrate 23. With this device, a terminal 27 is formed on the oriented polycrystalline ($Ga_{1-x}In_xN$) 29, and a terminal 28 is formed on the operating layer 31. Further, an n-GaN/i-GaN, n-$Ga_{1-x}Al_xN$/p-$Ga_{1-x}Al_xN$/p-$Ga_{1-x}Al_xN$ operating layer, is possible as well as the structures of FIGS. 4 to 13.

Figure 4:
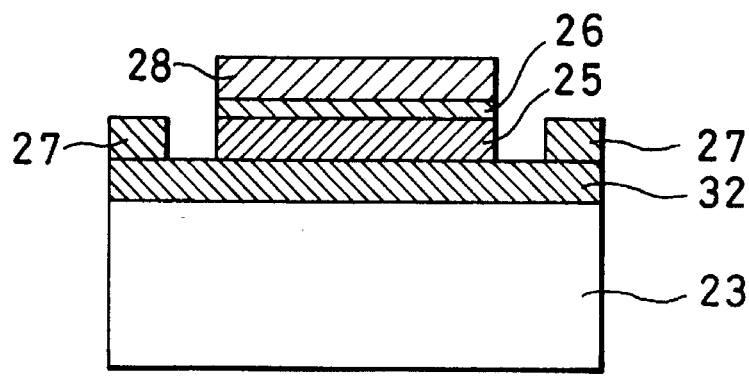
FIG. 4 is a sectional structural view showing a light emitting device comprising oriented polycrystalline $n^+$-GaN/n-GaN/P-GaN crystal.

With the structure of the operating layer shown in FIG. 4, a single crystal (n-GaN) 25/single crystal (p-GaN) 26 is formed on an oriented polycrystalline (n$^+$-GaN) 32 which is formed on the substrate 23. With this device, a terminal 27 is formed on the oriented polycrystalline (n$^+$-GaN) 32, and a terminal 28 is formed on the operating layer 26.

Figure 5:
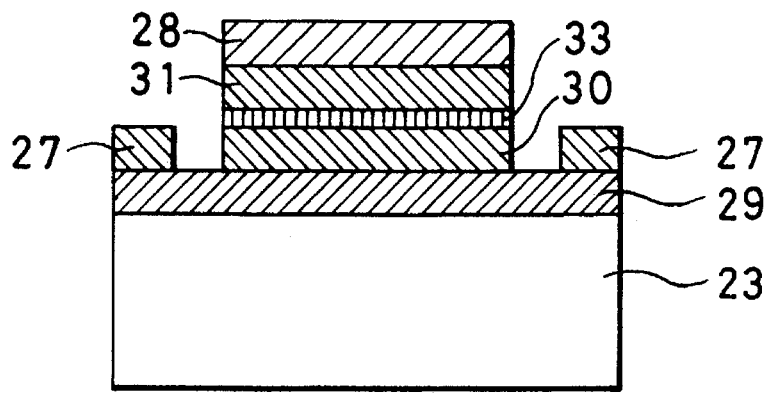
FIG. 5 is a sectional structural view showing a light emitting device comprising oriented polycrystalline $Ga_{1-x}In_xN/n-Ga_{1-x}In_xN/i-Ga_{1-x}In_xN/p-Ga_{1-x}In_xN$.

With the structure of the operating layer shown in FIG. 5, a single crystal (n-Ga$_{1-x}$In$_x$N) 30/single crystal (i-Ga$_{1-x}$In$_x$N) 33/(p-Ga$_{1-x}$In$_x$N) 31 where $0 \leq x \leq 1$, is formed on an oriented polycrystalline (Ga$_{1-x}$In$_x$N) 29 which is formed on the substrate 23. With this device, a terminal 27 is formed on the oriented polycrystalline (Ga$_{1-x}$In$_x$N) 29, and a terminal 28 is formed on the operating layer 31.

Figure 6:
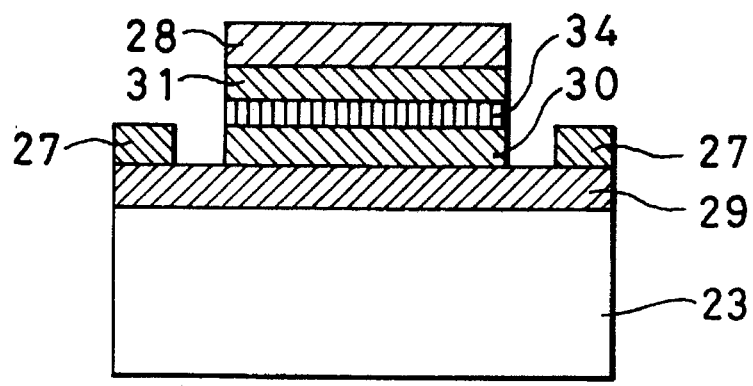
FIG. 6 is a sectional structural view showing a light emitting device comprising oriented polycrystalline $Ga_{1-x}In_xN/n-Ga_{1-x}In_xN/P-Ga_{1-y}In_yN/p-Ga_{1-x}In_xN$ ($x \leq y$).

With the structure of the operating layer shown in FIG. 6, a single crystal (n-Ga$_{1-x}$In$_x$N) 30/single crystal (p-Ga$_{1-y}$In$_y$N) 34/(p-Ga$_{1-x}$In$_x$N) 31 where $x \leq y$, $0 \leq x \leq 1$, $0 \leq y \leq 1$, is formed on an oriented polycrystalline (Ga$_{1-x}$In$_x$N) 29 which is formed on the substrate 23. With this device, a terminal 27 is formed on the oriented polycrystalline (Ga$_{1-x}$In$_x$N) 29, and a terminal 28 is formed on the operating layer 31.

Figure 7:
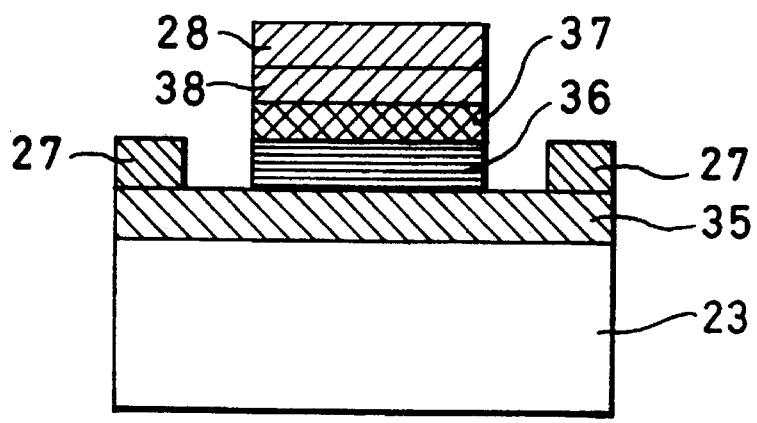
FIG. 7 a sectional structural view showing a light emitting device comprising oriented polycrystalline $Ga_{1-a}Al_aN/n-Ga_{1-a}Al_aN/p-Ga_{1-b}Al_bN/p-Ga_{1-a}Al_aN$ ($a \geq b$).

With the structure of the operating layer shown in FIG. 7, a single crystal (n-Ga$_{1-a}$Al$_a$N) 36/single crystal (p-Ga$_{1-b}$Al$_b$N) 37/(p-Ga$_{1-a}$Al$_a$N) 38 where $a \leq b$, $0 \leq a \leq 1$, $0 \leq b \leq 1$, is formed on an oriented polycrystalline (Ga$_{1-a}$Al$_a$N) 35 which is formed on the substrate 23. With this device, a terminal 27 is formed on the oriented polycrystalline (Ga$_{1-a}$Al$_a$N) 35, and a terminal 28 is formed on the operating layer 38.

Figure 8:
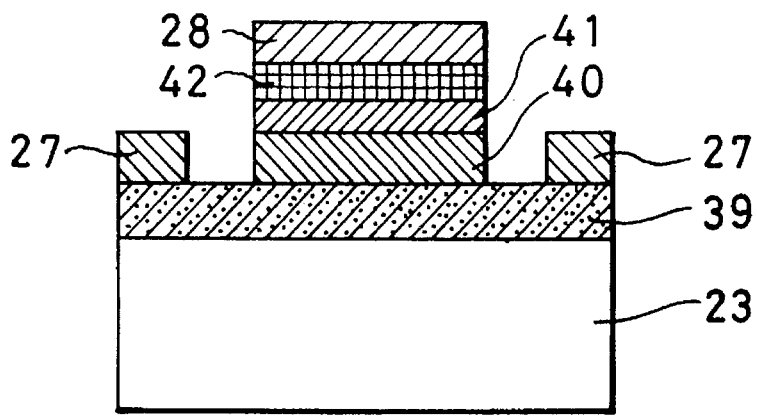
FIG. 8 is a sectional structural view showing a light emitting device comprising oriented polycrystalline $Ga_{1-x-y}In_xAl_yN/n-Ga_{1-x-y}In_xAl_yN/i-Ga_{1-a-b}In_aAl_bN/p-Ga_{1-x-y}In_xAl_yN$.

With the structure of the operating layer shown in FIG. 8, a single crystal (n-Ga$_{1-x-y}$In$_x$Al$_y$N) 40/single crystal (i-Ga$_{1-x-y}$In$_x$Al$_y$N) 41/single crystal (p-Ga$_{1-x-y}$In$_x$Al$_y$N) 42 where $0 \leq x+y \leq 1$, is formed on an oriented polycrystalline (Ga$_{1-x-y}$In$_x$Al$_y$N) 39 which is formed on the substrate 23. With this device, a terminal 27 is formed on the oriented polycrystalline (Ga$_{1-x-y}$In$_x$Al$_y$N) 39, and a terminal 28 is formed on the operating layer 42.

Figure 9:
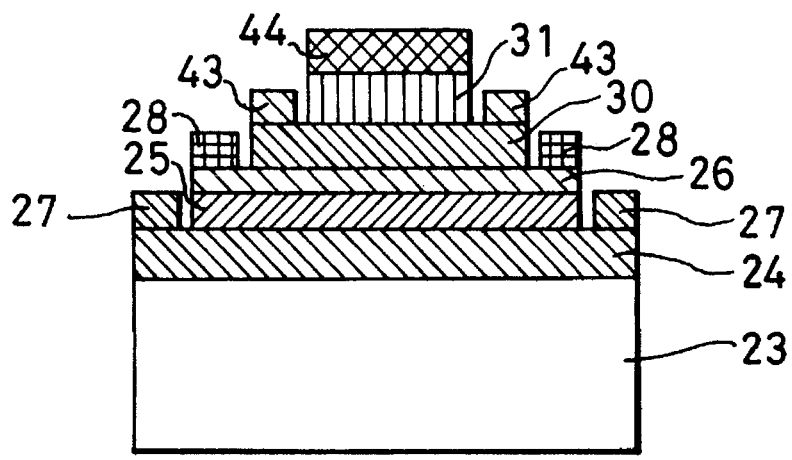
FIG. 9 is a sectional structural view showing a light emitting device comprising oriented polycrystalline GaN/n-GaN/n-GaN/p-GaN/n-$Ga_{1-x}In_xN$/p-$Ga_{1-x}In_xN$.

With the structure of the operating layer shown in FIG. 9, a single crystal (n-GaN) 25/single crystal (p-GaN) 26/single crystal (n-Ga$_{1-x}$In$_x$N) 30/single crystal (p-Ga$_{1-x}$In$_x$N) 31, is formed on an oriented polycrystalline GaN 24 which is formed on the substrate 23. With this device, respective terminals 27, 28 and 43 are formed on the oriented polycrystalline GaN 24, the single crystal (p-GaN) 26, and the single crystal (n-Ga$_{1-x}$In$_x$N) 30, and a terminal 44 is formed on the single crystal (p-Ga$_{1-x}$In$_x$N) 31 of the operating layer.

Figure 10:
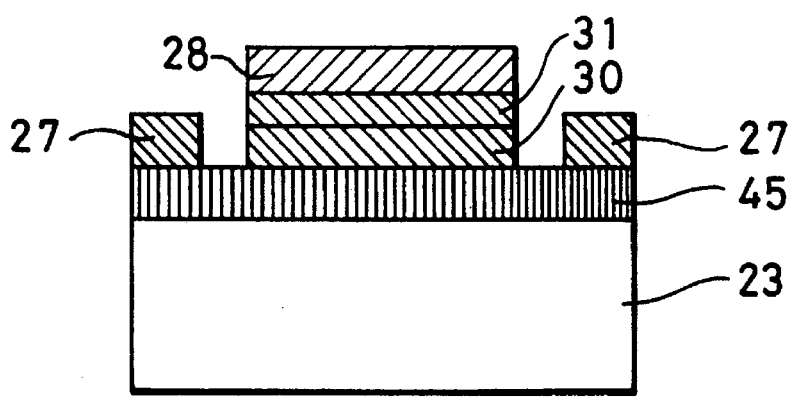
FIG. 10 is a sectional structural view showing a light emitting device comprising GaInN composition graded structure/n-$Ga_{1-x}In_xN$/p-$Ga_{1-x}In_xN$.

With the structure of the operating layer shown in FIG. 10, a single crystal (n-Ga$_{1-x}$In$_x$N) 30/single crystal (p-Ga$_{1-x}$In$_x$N) 31, is formed on a GaInN composition graded structural layer 45 which is formed on the substrate 23. With this device, a terminal 27 is formed on the composition graded structural layer 45, and a terminal 28 is formed on the operating layer 31.

Figure 11:
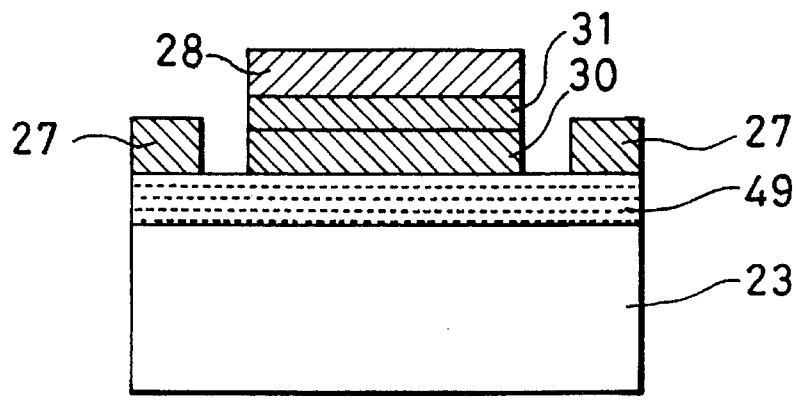
FIG. 11 is a sectional structural view showing a light emitting device comprising a strained super lattice structure/n-$Ga_{1-x}In_xN$/p-$Ga_{1-x}In_xN$.

With the structure of the operating layer shown in FIG. 11, a single crystal (n-Ga$_{1-x}$In$_x$N) 30/single crystal (p-Ga$_{1-x}$In$_x$N) 31 is formed on the strained super lattice structural layer 49 which is formed on the substrate 23. With this device, a terminal 27 is formed on the strained super lattice structural layer 49, and a terminal 28 is formed on the operating layer 31.

Figure 12:
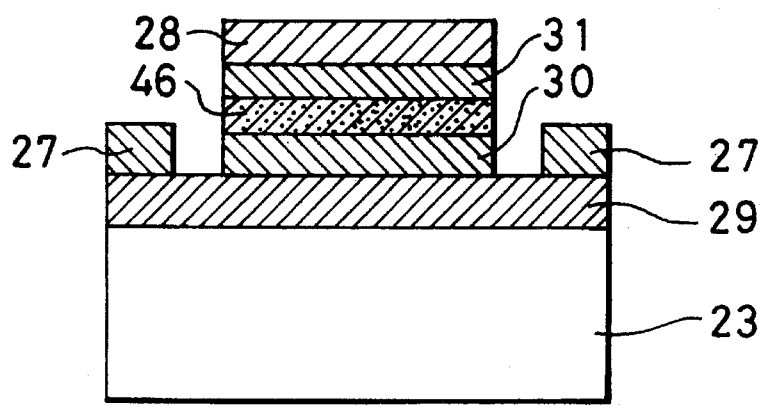
FIG. 12 is a sectional structural view showing a light emitting device comprising oriented polycrystalline $Ga_{1-x}In_xN/n-Ga_{1-x}In_xN$/a quantum well structure/p-$Ga_{1-x}In_xN$.

With the structure of the operating layer shown in FIG. 12, a single crystal (n-Ga$_{1-x}$In$_x$N) 30/quantum well layer 46/single crystal (p-Ga$_{1-x}$In$_x$N) 31, is formed on an oriented polycrystalline (Ga$_{1-x}$In$_x$N) 29 which is formed on the substrate 23. With this device, a terminal 27 is formed on the oriented polycrystalline (Ga$_{1-x}$In$_x$N) 29, and a terminal 28 is formed on the operating layer 31. The quantum well structure comprises an active layer of the nitride semiconductor layer of less than several hundred angstroms thick in order to obtain the quantum effect, sandwiched between wider band gap nitride semiconductor cladding layers. This type of structure involves a single quantum well structure. If this is stacked with a thin barrier layer in between to make a multiple quantum well structure, the light emission efficiency may be increased, and the emitted light threshold value current may be reduced.

Figure 13:
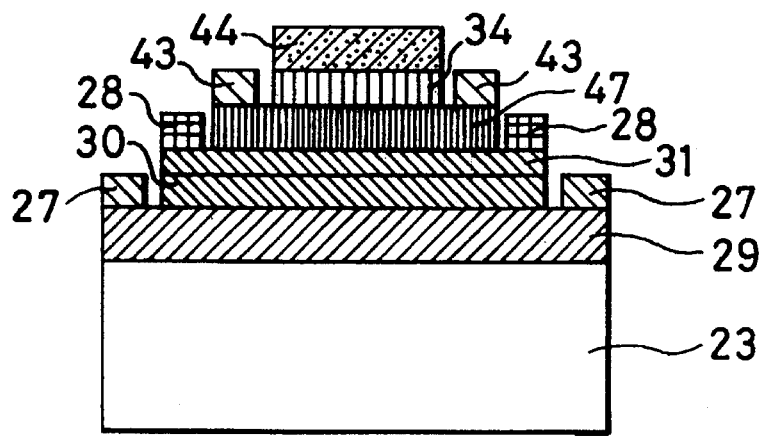
FIG. 13 is a sectional structural view showing a light emitting device comprising oriented polycrystalline $Ga_{1-x}In_xN/n-Ga_{1-x}In_xN/p-Ga_{1-x}In_xN/n-Ga_{1-y}In_yN/p-Ga_{1-y}In_yN$.

With the structure of the operating layer shown in FIG. 13, the light emitting layer has two layers. A single crystal (n-Ga$_{1-x}$In$_x$N) 30/single crystal (p-Ga$_{1-x}$In$_x$N) 31/single crystal (n-Ga$_{1-y}$In$_y$N) 47/single crystal (p-Ga$_{1-y}$In$_y$N) 34 is formed on an oriented polycrystalline (Ga$_{1-x}$In$_x$N) 29 which is formed on the substrate 23. With this device, respective terminals 27, 28 and 43 are formed on the oriented polycrystalline (Ga$_{1-x}$In$_x$N) 29, the single crystal (p-Ga$_{1-x}$In$_x$N) 31 and the single crystal (n-Ga$_{1-y}$In$_y$N) 47, and a terminal 44 is formed on the single crystal (p-Ga$_{1-y}$In$_y$N) 34 of the operating layer. With this device, if a voltage is applied for example between the terminals 27 and 28, a blue light is emitted, if the voltage is applied between the terminals 43 and 44 a green light is emitted, while if the voltage is applied between the terminals 27 and 44 a yellow light is emitted. By selecting the terminals between which to apply the voltage, a light emitting device with two different colored light emissions or an intermediate color light emission is thus possible.

The film thickness of the operating layer of the single crystal nitride semiconductor should be thin in order to facilitate the etching process. A thickness of less than 5 microns is preferable and more preferably less than 3 microns. In the case of a light emitting device, the operating layer should be made thin in order to improve the light output emission efficiency. The thickness should be less than 3 microns, and in particular with short wavelength light emitting devices, the operating layer should be as thin as possible due to the susceptibility to light absorption. However, the layer should be thick enough to ensure that a tunnel current flow does not occur. Hence the thickness should be at least 100 angstroms thick.

When used as a semiconductor light emitting device, for example a metal insulator semiconductor (MIS) device, then with an i-type single crystal nitride semiconductor operating layer, the thickness should be no more than 5000 angstroms. If the thickness is greater than this, current flow becomes difficult so that use as a light emitting device is not possible. With a p-n junction device it is necessary for the thickness of both the p-type and n-type single crystal nitride semiconductors operating layers to be no more than 3 microns thick. With greater film thickness growth time becomes excessive making device production impractical. Also efficiency in extraction of the emitted light is reduced.

When adapted for use as a semiconductor device, a surface layer of p-type or i-type single crystal nitride semiconductor is necessary with terminals formed on this surface layer. Although efficient extraction of the light emitted in the operating layer is possible from the substrate side, it is also possible to remove this light from the surface layer side. To remove the light from the surface layer side, the terminal formed in a pattern to ensure a uniform voltage distribution over the surface layer should cover no more than 50% of the surface area. Preferably the light should be taken from the terminal side rather than having to pass through the thick substrate layer. Hence if the terminal covers more than 50% of the surface layer, light extraction efficiency is reduced. The terminal pattern may comprise shapes such as a comb shape, a meandering shape or a net shape.

The material used for the terminal for applying a voltage to the surface of the nitride semiconductor may be a simple metal such as Al, In, Cu, Ag, Au, Pt, Ir, Pd, Rh, W, Ti, Ni, Co, Sn, or Pb. Alternatively alloys of these metals or silicides of Pt, W, or Mo and the like may be used. Moreover, stannic oxide, indium oxide, stannic oxide-indium oxide, or degenerated ZnSe and the like may be used. Of particular suitability for the terminal formed on the n-type nitride semiconductor are the simple metals such as Al, In, Ti, Cu, Zn, Co, Ag, Sn or Pb, or alloys of these. In particular when the emitted light is removed from the terminal side, the pattern used for the terminals on the p-type or i-type nitride semiconductor should preferably be a meander type, net type or comb type pattern. The width and spacing between the terminals may be varied depending on the magnitude of the electrical resistance and imprinted voltage related to the p-type or i-type semiconductor layer. Reducing the width of the terminal and the terminal spacing may enhance the light extraction efficiency for the situation where the light is extracted through the terminals.

As follows is a description of methods of manufacture of nitride semiconductor devices according to the present invention.

With the method of manufacture of a nitride semiconductor thin film according to the present invention, a crystal growth apparatus having a gas source for the supply of a compound including nitrogen in a gaseous state, and a solid body source for the supply of Group III constituents is used. The gaseous state compound including nitrogen, and the Group III constituents are supplied to the substrate surface with the substrate at a temperature of 300° C.–1000° C. under a pressure of less than $10^{-5}$ Torr. Under these conditions, a first layer is grown on the substrate surface at a growth rate of 0.10–20 angstroms per second. Subsequently, the gaseous state compound including nitrogen, and the Group III constituent are supplied to the surface of the first layer at a substrate temperature of 300° C.–1000° C. under a pressure of less than $10^{-5}$ Torr, and a single crystal nitride semiconductor layer is grown at a growth rate of 0.10–10 angstroms per second, thereby forming a nitride semiconductor device.

Here the compound including nitrogen may be one of ammonia, nitrogen triflouride, hydrazine or dimethylhydrazine. Alternatively a gas mixture with these as the principal constituents may be used. Furthermore, the ammonia, nitrogen triflouride, hydrazine, or dimethylhydrazine may be diluted with nitrogen, or an inert gas such as argon or helium. A gas cell may be used to supply this gas. This may be provided in the crystal growth apparatus with an opening facing the substrate. The shape of the opening may be for example a nozzle shape, a slit shape or consist of perforations. The gas supply equipment should preferably comprise a valve and flow control device fitted to piping connected to the gas cell opening, with a pressure regulator connected so that the mixture and supply quantity of the above gases may be controlled, and the supply may be turned on and off. Furthermore, in order to produce high quality nitride semiconductor thin films, it should be possible to heat the nitrogen containing compound for supply to the substrate surface by heating the gas cell to a predetermined temperature. To efficiently heat the gas cell, materials having high corrosion resistance such as alumina, silica, boron nitride, silicone carbide may be used in a fibrous, flaked, crushed or granular form. By filling the gas cell with these, or fitting them into the gas cell in a perforated form, the contact surface area provided for the gaseous state compound in the gas cell may be increased thereby improving heating efficiency. It is necessary to change the heating temperature depending on the type of filler material in the gas cell, and the supply amount of nitrogen containing compounds. Preferably the temperature should be set within the range from 100° C.–700° C. Furthermore, it is possible to use a plasma gas cell to activate the nitrogen or ammonia supplied to the substrate surface. The amount of gaseous compound supplied to the substrate surface should be greater than that of the Group III constituents. If the supply amount is less than this, the nitride semiconductor being formed is deprived of a significant amount of the nitrogen supplied from the gaseous compound, making it difficult to produce a satisfactory semiconductor thin film. Accordingly, the supply amount of gaseous state compound should be at least 10 times, preferably 100 times, and more preferably 1000 times the supply amount for the Group III constituents.

With the present invention., the pressure during growing should be not greater than $10^{-5}$ Torr. This is so that the gaseous state nitrogen containing compound, and the metal vapor, both necessary for growth of the nitride semiconductor thin film reach the substrate surface without colliding with each other. If the pressure is above $10^{-5}$ Torr the impurities within the growing chamber become excessive and reaction may occur before reaching the substrate surface, making it difficult to obtain a nitride semiconductor thin film having good crystallization. It is particularly important to ensure that impurities such as compounds containing carbon or oxygen are kept to a minimum. In this respect, by suppressing the partial pressures of carbon monoxide and carbon dioxide, the amount of oxygen and carbon diffusing into the nitride semiconductor thin film may be kept to a minimum. Accordingly the partial pressure of carbon monoxide and carbon dioxide should be kept to below $10^{-8}$ Torr and more preferably below $10^{-10}$ Torr. The type and concentration of the gas impurities may be measured by means of a quadrupole mass spectrometer.

The growth temperature for the nitride semiconductor thin film is 300° C.–1000° C. However, within this range, the composition of the nitride semiconductor thin film may be changed by the type of nitrogen containing compound used, the doping material and the growth rate.

The growth rate of the nitride semiconductor thin film of the present invention should be from 0.1–20 angstroms per second. With a growth rate of less than 0.1 angstroms per second, an excessively long growth time is necessary to obtain the required film thickness. Consequently an excessive amount of impurities from the growth atmosphere enter the film, making it difficult to produce a good quality nitride semiconductor thin film. With a growth rate greater than 20 angstroms per second, island type growth occurs so that a good quality nitride semiconductor thin film is not possible. For growing an oriented polycrystalline nitride semiconductor thin film, the growth rate should be from 0.1–20 angstroms per second, and for the subsequent growth of a single crystal nitride semiconductor thin film on the oriented polycrystalline nitride semiconductor layer, the growth rate should be from 0.1–10 angstroms per second. Growth rate may be controlled by changing the amount of the principal Group III constituent supplied to the substrate surface. This may be achieved by adjusting the temperature of the crucible used for evaporating the Group III constituent. Growth rate may also be controlled by changing the nitrogen containing compound supply rate, and by changing the substrate temperature.

For the solid body source in the present invention the Group III simple or alloy metals or metal salts may be used for providing the Group III constituent. At least one of the Group III constituents may be selected aluminum, gallium and indium.

In the manufacture of the nitride semiconductor thin film of the present invention, carrier density control, and p-type, i-type or n-type conduction type control may be achieved by impurity doping. To obtain the p-type or i-type nitride semiconductor thin film, a doping impurity such as Mg, Ca, St, Zn, Be, Cd, Hg or Li may be used. In obtaining the n-type nitride semiconductor thin film, the carrier type and carrier density may be changed by changing the amount of Si used as the doping impurity. In this case, the doping concentration in the direction of the film thickness may be changed, and the δ doping method for doping only a specific layer may be used. Conduction type control may also be promoted by irradiating with an electron beam or ultraviolet rays during doping. Furthermore, on completion of the stacked layer construction, electron beamed irradiation and heat treatment may be used to improve the p-type efficiency.

With the present invention, in producing the nitride semiconductor thin film by the MBE method, the nitrogen containing compound and the Group III constituent may be supplied to the substrate surface simultaneously, or successively. Alternatively, the thin film growth may be interrupted and the thin film subjected to a method to promote crystallization. It may be preferable during thin film growth to observe that the streak observable by the RHEED pattern is visible.

As follows, is a description of methods of manufacture of semiconductor light emitting devices utilizing a nitride semiconductor stacked construction made by the MBE method using ammonia gas. The present invention however is not limited to these examples.

Figure 14:
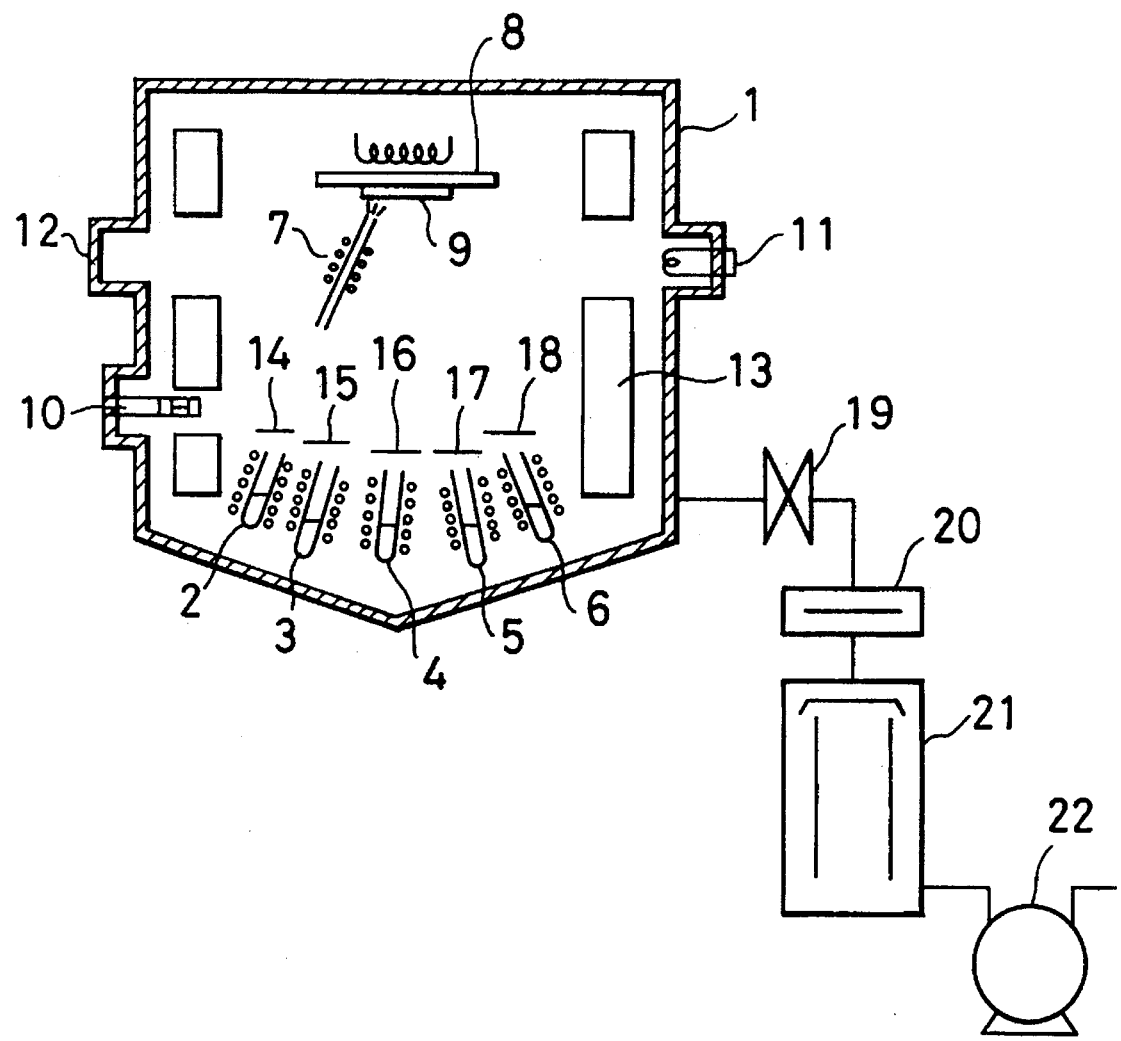
FIG. 14 is a schematic view showing a crystal growing apparatus used in producing thin films.

The equipment used, as show in FIG. 14 comprises a crystal growth apparatus fitted with a vacuum chamber 1 housing evaporation crucibles (Knudsen cells) 2, 3, 4, 5 and 6, a gas cell 7, a substrate heating holder 8 on which is mounted a substrate 9. Other equipment includes a quadrupole mass spectrometer 10, a RHEED electron gun 11, a RHEED screen 12, a shroud 13, shutters 14–18, a valve 19, a cold trap 20, a diffusion pump 21 and an oil-sealed rotary vacuum pump 22.

Gallium metal is placed in the evaporation crucible 2 and heated to a temperature suitable for a growth rate on the substrate surface of $10^{13}$–$10^{17}$/cm$^2$ second. Ammonia is introduced through the gas cell 7 so as to impinge directly onto the substrate 9. A sufficient amount is supplied so as to produce a growth rate of $10^{16}$–$10^{20}$/cm$^2$ sec. on the substrate service. Indium, aluminum, arsenic, or tin and the like are placed in the evaporation crucibles 3 and 4, and the temperature and supply time controlled so as to grow a mixed crystal compound semiconductor of a predetermined composition. Magnesium, calcium, strontium, zinc, beryllium, cadmium, mercury and lithium and the like are placed in the evaporation crucible 5 while silicon, germanium, carbon, tin, sulfur, selenium and tellurium and the like are placed in the evaporation crucible 6. Doping is then performed by adjusting the temperature and supply time to give a predetermined supply amount.

The R face of sapphire is used as the substrate 9 and this is heated within the range of 300° C. to 900° C.

At first the substrate 9 is heated in the vacuum chamber 1 to a temperature of 900° C. A predetermined growth temperature is then set and a layer of oriented polycrystalline nitride semiconductor having a thickness ranging from 10–500 angstroms is grown at a growth rate of 0.1–20 angstroms per second. Evaporation crucible 6 may be used for n-type doping to improve conductivity in the nitride semiconductor layer. Furthermore, an n-type single crystal nitride semiconductor layer of a thickness from 0.05–3 microns may be formed on the nitride semiconductor layer at a growth rate of 0.1–10 angstroms per second. Subsequently, by opening the gallium shutter of the evaporation crucible 2 and the shutter of the evaporation crucible 5 together, a 100–10000 angstroms thick doped layer of nitride semiconductor doped with p-type or i-type dopant may be grown on the n-type single crystal nitride semiconductor layer, thereby fabricating a laminated structure nitride semiconductor.

As follows is a description of a semiconductor light emitting device incorporating the above mentioned laminated structure. The shape of the device together with the terminals for applying current to the element is defined by using a lithographic process on the laminated structure. The lithographic process involves the use of standard photoresist materials. Dry etching is preferably used in the etching process. In the dry etching process, standard processes involving ion milling, ECR etching, reactive ion etching, ion beam assisted etching, and focused ion beam etching may be used. In particular the present invention has the advantage that since the overall film thickness of the nitride semiconductor laminated thin film is small, the dry etching process may be most effectively applied. Moreover, if the nitride semiconductor laminated thin film is damaged by the dry etching process, then by heat treating in an atmosphere of the nitrogen containing compound of the present invention, or nitrogen or an inert gas such as argon or helium an device having even better properties can be obtained. The heat treatment temperature and period may be changed to suit the composition and structure of the nitride semiconductor of the device. For example, with a GaN light emitting device, heat treatment at 500° C. for 30 minutes in a flow of ammonia is sufficient to restore damage to the surface due to etching.

The terminals used for applying a uniform voltage to the surface of the nitride semiconductor may be produced by the MBE method, CVD method, vacuum evaporation method, electron beam evaporation method, or by sputtering. In particular when the emitted light is removed from the terminal side, the pattern used for the terminals on the p-type or i-type nitride semiconductor should preferably be a meander type, net type or comb type pattern. The width and spacing between the terminals may be varied depending on the magnitude of the electrical resistance and imprinted voltage related to the p-type or i-type semiconductor layer. Reducing the width of the terminal and the terminal spacing may enhance the light extraction efficiency for the situation where the light is extracted through the terminals. Moreover, in this case also by heat treating in an atmosphere of the nitrogen containing compound of the present invention, or nitrogen or an inert gas such as argon or helium, after formation of the terminals, an device having even better properties can be obtained. The heat treatment temperature and period may be changed depending on the terminal material and structure. For example, with an MIS type GaN light emitting device using Al in an n-type nitride semiconductor and Au in an i-type nitride semiconductor, heat treatment at 400° C. for 60 minutes in a flow of argon gas results in an excellent metal/semiconductor contact.

The laminated structure produced by the above method may be cut by a dicing saw to give the device chip. Subsequently, after setting in a lead frame, wiring using gold leads or aluminum leads may be attached using a die bonding method and/or a wire bonding method. The device may then be packaged using epoxy resin, metallic resin or carbonate resin to give a light emitting device.

As follows is a more detailed description of examples.

EXAMPLE 1

An example illustrating the manufacture of a GaN semiconductor light emitting device by the MBE method using ammonia is given below.

In this process a crystal growing apparatus comprising evaporation crucibles 2, 3, 4, 5, 6, a gas cell 7 and a substrate heating holder 8 housed inside a vacuum chamber 1 is used.

At first a charge of gallium metal is placed in the evaporation crucible 2 and heated to a temperature of around 1020° C., and a charge of zinc is placed in the evaporation crucible 5 and heated to a temperature of around 190° C. Gas is supplied by the gas cell 7 which is filled with alumina fiber. The gas is heated to a temperature of 370° C. by the gas cell 7 and directed onto the substrate 9 at a flow rate of 5 cc/minute.

A sapphire R face substrate is used for the substrate 9. In this case, the atomic spacing forming the line of intersection of the A and C faces of the GaN differs from the sapphire substrate atomic spacing by 15.7%, and three times the C-axis length of the GaN differs from the sapphire substrate atomic spacing by 0.7%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible 2 is opened while supplying a stream of ammonia gas from the gas cell 9 to the substrate. As a result, a thin film of multiply oriented crystalline GaN approximately 1000 Angstroms thick is deposited on the substrate surface at a film growth rate of approximately 1.2 Angstroms/second. The temperature of crucible 2 is then raised to 1010° C., and a 3500 Angstroms thick layer of single crystal n-GaN is deposited at a film growth rate of approximately 1.0 Angstroms/second. Subsequently, the crucible 2 shutter and the zinc crucible 5 shutter are opened together, and a single crystal layer of p-GaN doped with zinc is deposited to a thickness of 500 Angstroms, thereby producing a nitride semiconductor laminated structure.

A terminal for supplying current to the device is then formed on the laminated thin film by a lithographic process. This may involve the use of standard photoresist materials. In the etching process, the n-GaN layer and the p-GaN layer may be removed by ion milling with argon to form the spaces for the pattern of the terminal used to apply a voltage to the device. After removing the resist, the device is heat treated in ammonia gas at 500° C. for 30 minutes. A resist pattern for the terminals is then applied, and a 3000 Angstroms thick aluminum terminal layer deposited on the multiply oriented crystalline GaN layer, and a 3000 Angstroms thick gold layer deposited on the p-GaN layer using the vacuum deposition method. The device is then heat treated in Argon gas at 400° C. for 60 minutes.

Figure 15:
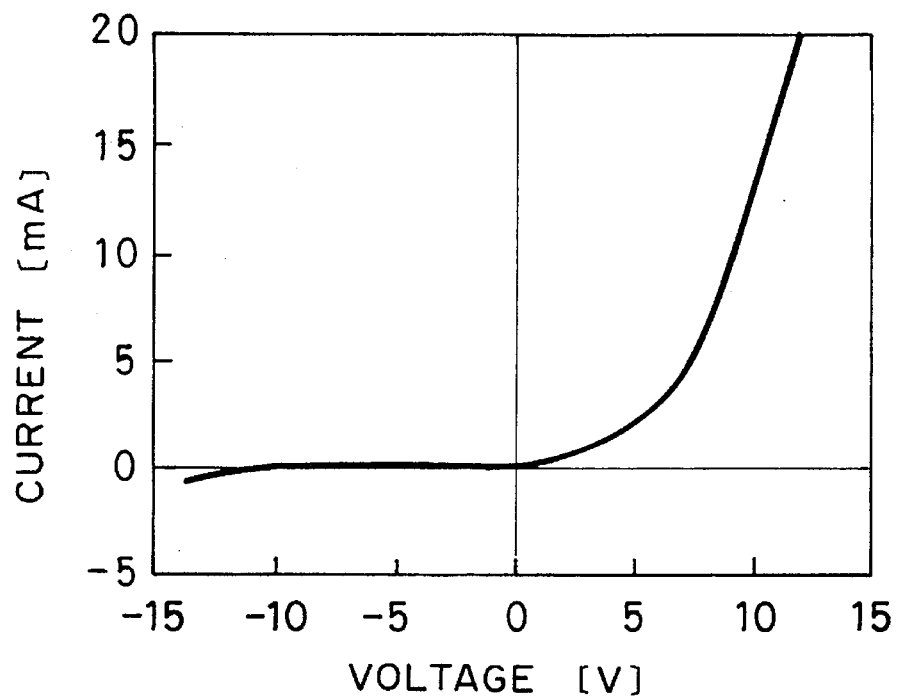
FIG. 15 is a graph illustrating the diode-characteristics of a GaN light emitting device manufactured according to a first working example.
Figure 16:
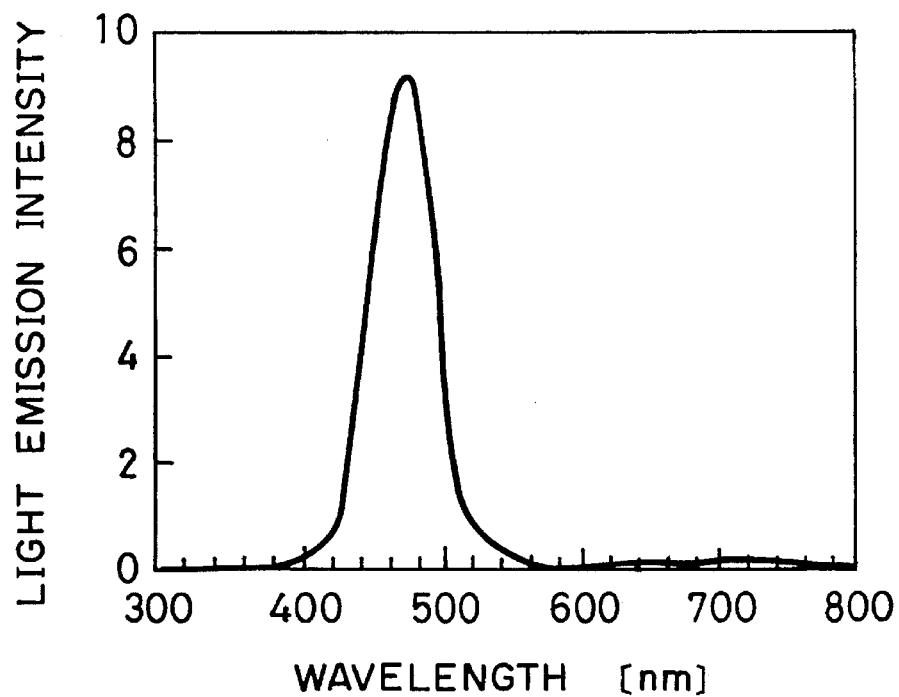
FIG. 16 is a graph illustrating the emission spectrum of a GaN light emitting device made according to the first working example.

The laminated structure formed in this way was then cut up with a dicing saw and wired with gold wire using a wire bonder. The device structure of the present invention is shown in FIG. 2, while the measured results of diode characteristics, and emitted light spectrum are shown in FIGS. 15 and 16 respectively. This device gave a blue light emission having a wave length of 470 nm and intensity of 90 mcd when a current of 20 mA was supplied to the device.

EXAMPLE 2

Another example illustrating the manufacture of a GaN semiconductor light emitting device by the MBE method using ammonia is given below.

In this process a crystal growing apparatus the same as that used in Example 1 is used. At first a charge of gallium metal is placed in the evaporation crucible 2 and heated to a temperature of around 1020° C., and a charge of Mg is placed in the evaporation crucible 5 and heated to a temperature of around 280° C. Gas is supplied by the gas cell 7 which is filled with alumina fiber. The gas is heated to a temperature of 370° C. by the gas cell 7 and directed onto the substrate 9 at a flow rate of 5 cc/minute.

A sapphire R face substrate is used for the substrate 9.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium evaporation crucible 2 is opened while supplying a stream of ammonia gas from the gas cell 7 to the substrate. As a result, a thin film of multiply oriented crystalline GaN approximately 1000 Angstroms thick is deposited on the substrate surface at a film growth rate of approximately 1.2 Angstroms/second.

The temperature of crucible 2 is then raised to 1010° C., and a 3500 Angstroms thick layer of single crystal n-GaN is deposited at a film growth rate of approximately 1.0 Angstroms/second. Subsequently, the crucible 2 shutter and the Mg crucible 5 shutter are opened together, and a single crystal layer of i-GaN doped with Mg is deposited to a thickness of 500 Angstroms, thereby producing a nitride semiconductor laminated structure.

The laminated thin film was then made into a light emitting device using methods similar to those used for Example 1.

This device gave a purple light emission having a wave length of 430 nm and an intensity of 5 mcd when a current of 20 mA was supplied to the device.

EXAMPLE 3

Another example illustrating the manufacture of a $Ga_{1-x}In_x$ (x=0.1) semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., a charge of In is placed in the evaporation crucible 3 and heated to a temperature of around 820° C., and a charge of Mg is placed in the evaporation crucible 5 and heated to a temperature of around 280° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

A sapphire R face substrate is used for the substrate 9. In this case, the atomic spacing forming the line of intersection of the A and C faces of the $Ga_{0.9}In_{0.1}N$ differs from the sapphire substrate atomic spacing by 16.0%, and three times the C-axis length of the $Ga_{0.9}In_{0.1}N$ differs from the sapphire substrate atomic spacing by 1.8%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 700° C. for growing the thin film. To grow the thin film, the shutters of the gallium evaporation crucible 2 and the In evaporation crucible 3 are opened together while supplying a stream of ammonia gas from the gas cell 9 to the substrate. As a result, a thin film of multiply oriented crystalline $Ga_{0.9}In_{0.1}N$ approximately 1700 Angstroms thick is deposited on the substrate surface at a film growth rate of approximately 1.3 Angstroms/second. The temperature of crucible 2 is then raised to 1010° C., and the temperature of crucible 3 raised to a temperature of 800° C., and a 3500 Angstroms thick layer of single crystal n-$Ga_{0.9}In_{0.1}N$ is deposited at a film growth rate of approximately 1.0 Angstroms/second. Subsequently, the crucible 2 shutter and the Mg crucible 5 shutter are opened together, and an i-single crystal $Ga_{0.9}In_{0.1}N$ layer doped with Mg is deposited to a thickness of 500 Angstroms, thereby producing a nitride semiconductor laminated structure.

The laminated thin film was then made into a light emitting device using methods similar to those used for Example 1.

This device gave a blue light emission having a wave length of 480 nm and an intensity of 50 mcd when a current of 20 mA was supplied to the device.

EXAMPLE 4

Another example illustrating the manufacture of a $Ga_{1-x}In_x$ (x=0.3) semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., a charge of In is placed in the evaporation crucible 3 and heated to a temperature of around 880° C., and a charge of Mg is placed in the evaporation crucible 5 and heated to a temperature of around 280° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

A sapphire R face substrate is used for the substrate 9. In this case, the atomic spacing forming the line of intersection of the A and C faces of the $Ga_{0.7}In_{0.3}N$ differs from the sapphire substrate atomic spacing by 16.7%, and three times the C-axis length of the $Ga_{0.7}In_{0.3}N$ differs from the sapphire substrate atomic spacing by 4.3%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 680° C. for growing the thin film. To grow the thin film, the shutters of the gallium evaporation crucible 2 and the In evaporation crucible 3 are opened together while supplying a stream of ammonia gas from the gas cell 9 to the substrate. As a result, a thin film of multiply oriented crystalline $Ga_{0.9}In_{0.3}N$ approximately 1700 Angstroms thick is deposited on the substrate surface at a film growth rate of approximately 1.5 Angstroms/second. The temperature of crucible 2 is then raised to 990° C., and the temperature of crucible 3 raised to a temperature of 840° C., and a 3500 Angstroms thick layer of single crystal n-$Ga_{0.7}In_{0.3}N$ is deposited at a film growth rate of approximately 1.0 Angstroms/second. Subsequently, the crucible 2 shutter and the Mg crucible 5 shutter are opened together, and an i-single crystal $Ga_{0.7}In_{0.3}N$ layer doped with Mg is deposited to a thickness of 500 Angstroms, thereby producing a nitride semiconductor laminated structure.

The laminated thin film was then made into a light emitting device using methods similar to those used for Example 1.

This device gave a green light emission having a wave length of 540 nm and an intensity of 70 mcd when a current of 20 mA was supplied to the device.

EXAMPLE 5

Another example illustrating the manufacture of a $Ga_{1-x}Al_x$ (x=0.3) semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., a charge of Al is placed in the evaporation crucible 4 and heated to a temperature of around 1070° C., and a charge of Mg is placed in the evaporation crucible 5 and heated to a temperature of around 280° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

A sapphire R face substrate is used for the substrate 9. In this case, the atomic spacing forming the line of intersection of the A and C faces of the $Ga_{0.7}Al_{0.3}N$ differs from the sapphire substrate atomic spacing by 14.5%, and three times the C-axis length of the $Ga_{0.7}In_{0.3}N$ differs from the sapphire substrate atomic spacing by 0.9%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 8° C. for growing the thin film. To grow the thin film, the shutters of the gallium evaporation crucible 2 and the In evaporation crucible 3 are opened together while supplying a stream of ammonia gas from the gas cell 9 to the substrate. As a result, a thin film of multiply oriented crystalline $Ga_{0.7}In_{0.3}N$ approximately 1900 Angstroms thick is deposited on the substrate surface at a film growth rate of approximately 1.5 Angstroms/second. The temperature of crucible 2 is then raised to 990° C., and the temperature of crucible 3 raised to a temperature of 10° C., and a 3500 Angstroms thick layer of single crystal n-$Ga_{0.7}Al_{0.3}N$ is deposited at a film growth rate of approximately 1.0 Angstroms/second. Subsequently, the crucible 2 shutter and the Mg crucible 5 shutter are opened together, and an i-single crystal $Ga_{0.7}In_{0.3}N$ layer doped with Mg is deposited to a thickness of 500 Angstroms, thereby producing a nitride semiconductor laminated structure.

The laminated thin film was then made into a light emitting device using methods similar to those used for Example 1.

This device gave a purple light emission having a wave length of 370 nm and a power of 0.5 mW when a current of 20 mA was supplied to the device.

EXAMPLE 6

Another example illustrating the manufacture of a GaN semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

The sapphire face shown in FIG. 1 inclined at 9.2 degrees to the R face towards the A face is used for the substrate 9. In this case, four times the atomic spacing forming the line of intersection of the A and C faces of the GaN differs from the sapphire substrate atomic spacing by 1.0%, and three times the C-axis length of the GaN differs from the sapphire substrate atomic spacing by 0.7%.

The vacuum chamber is evacuated to a pressure of $2 \times 10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 1000 Angstroms thick is deposited on the substrate surface at a film growth rate of approximately 1.2 Angstroms/second. The temperature of crucible 2 is then raised to 1010° C., and a 4000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This element gave a blue light emission having a wave length of 470 nm and an intensity of 110 mcd when a current of 20 mA was supplied to the device.

EXAMPLE 7

Another example illustrating the manufacture of a GaN semiconductor light emitting device by the MBE method using ammonia is given below.

In this process a crystal growing apparatus the same as that used in Example 1 is used. At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

The face inclined at 20.2 degrees to the sapphire (10 $\bar{1}$ 0) face towards the C face is used for the substrate 9. In this case, one times the atomic spacing forming the line of intersection of the A and C faces of the GaN differs from the sapphire substrate atomic spacing by 33.2%, and eight times the C-axis length of the GaN differs from the sapphire substrate atomic spacing by 0.5%.

The vacuum chamber is evacuated to a pressure of $2 \times 10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 4600 Angstroms thick is deposited on the substrate surface at a film growth rate of approximately 1.2 Angstroms/second. The temperature of crucible 2 is then raised to 1010° C., and a 4000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 60 mcd when a current of 20 mA was supplied to the device.

EXAMPLE 8

Another example illustrating the manufacture of a GaN semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

Figure 17:
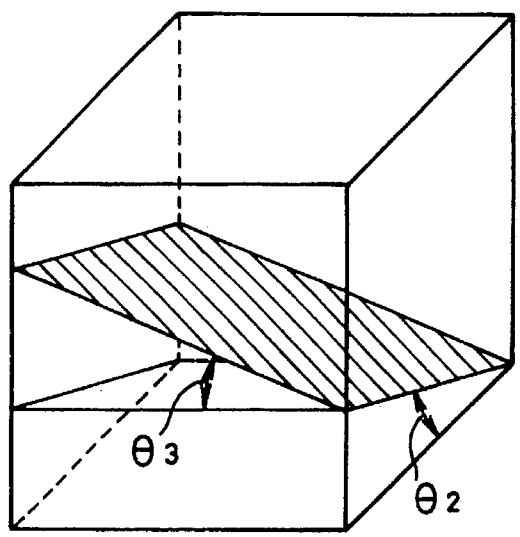
FIG. 17 is a perspective view showing a cubic crystal system showing a crystal face inclined at an angle of $\theta 2$ to the (001) face towards the (100) face, and an angle of $\theta 3$ towards the (010) face.

The face shown in FIG. 17 inclined at 11.3 degrees ($\theta 2$) to the MgO (001) face towards the (100) face, and 11.3 degrees ($\theta 3$) towards the (010) face is used for the substrate 9. In this case, two times the atomic spacing forming the line of intersection of the A and C faces of the GaN differs from the MgO substrate atomic spacing by 2.7%, and two times the C-axis length of the GaN differs from the MgO substrate atomic spacing by 3.9%.

The vacuum chamber is evacuated to a pressure of $2 \times 10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 2000 Angstroms thick is deposited on the substrate surface at a film growth rate of approximately 1.2 Angstroms/second. The temperature of crucible 2 is then raised to 1010° C., and a 4000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 45 mcd when a current of 20 mA was supplied to the device.

EXAMPLE 9

Another example illustrating the manufacture of a GaN semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

The $SrTiO_3$ (110) face is used for the substrate 9. In this case, one times the atomic spacing forming the line of intersection of the A and C faces of the GaN differs from the $SrTiO_3$ substrate atomic spacing by 0.2%, and two times the C-axis length of the GaN differs from the $SrTiO_3$ substrate atomic spacing by 32.3%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 2500 Angstroms thick is deposited on the substrate surface at a film growth rate of approximately 1.2 Angstroms/second. The temperature of crucible 2 is then raised to 1010° C., and a 3000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 40 mcd when a current of 20 mA was supplied to the device.

EXAMPLE 10

Another example illustrating the manufacture of a GaN semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

The $TiO_2$ (110) face is used for the substrate 9. In this case, one times the atomic spacing forming the line of intersection of the A and C faces of the GaN differs from the $TiO_2$ substrate atomic spacing by 0.9%, and one times the C-axis length of the GaN differs from the $TiO_2$ substrate atomic spacing by 12.3%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 2400 Angstroms thick is deposited on the substrate surface at a film growth rate of approximately 1.2 Angstroms/second. The temperature of crucible 2 is then raised to 1010° C., and a 3000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 48 mcd when a current of 20 mA was supplied to the device.

EXAMPLE 11

Another example illustrating the manufacture of a GaN semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

The $CaF_2$ (100) face is used for the substrate 9. In this case, one times the atomic spacing forming the line of intersection of the A and C faces of the GaN differs from the $CaF_2$ substrate atomic spacing by 0.9%, and one times the C-axis length of the GaN differs from the $CaF_2$ substrate atomic spacing by 5.5%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 1800 Angstroms thick is deposited on the substrate surface at a film growth rate of approximately 1.2 Angstroms/second. The temperature of crucible 2 is then raised to 1010° C., and a 4000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 52 mcd when a current of 20 mA was supplied to the device.

EXAMPLE 12

Another example illustrating the manufacture of a GaN semiconductor light emitting device by the MBE method using ammonia is given below.

In this process a crystal growing apparatus the same as that used in Example 1 is used.

At first a charge of gallium metal is placed in the evaporation crucible 2 and heated to a temperature of around 1020° C., and a charge of Zn is placed in the evaporation crucible 5 and heated to a temperature of around 190° C. Ammonia gas is used in the process. This is supplied by the gas cell 7 which is filled with alumina fiber. The ammonia gas is heated to a temperature of 370° C. by the gas cell 7 and directed onto the substrate 9 at a flow rate of 5 cc/minute.

Figure 18:
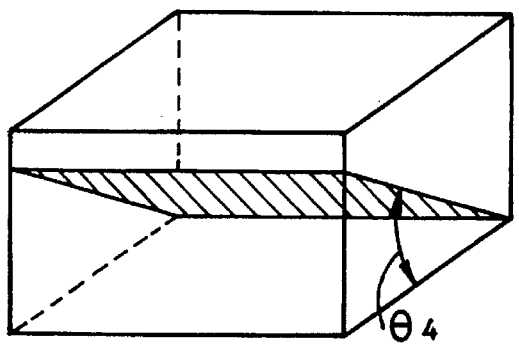
FIG. 18 is a perspective view showing a orthorhombic crystal system showing a face inclined at an angle of $\theta 4$ to the (001) face towards the (100) face.

The face shown in FIG. 18 inclined at 23.7 degrees (θ4) to the MgF$_2$ (110) face towards the (100) face is used for the substrate 9. In this case, one times the atomic spacing forming the line of intersection of the A and C faces of the GaN differs from the MgF$_2$ substrate atomic spacing by 0.5%, and three times the C-axis length of the GaN differs from the MgF$_2$ substrate atomic spacing by 2.2%.

The vacuum chamber is evacuated to a pressure of $2\times10^{-6}$ Torr for growing the thin film.

The substrate 9 is first heated and held at a temperature of approximately 900° C. for 30 minutes. The temperature is then lowered to 750° C. for growing the thin film. To grow the thin film, the shutter of the gallium crucible is opened while supplying a stream of ammonia gas from the gas cell 9 to the substrate. As a result, a thin film of multiply oriented crystalline GaN approximately 1000 Angstroms thick is deposited on the substrate surface at a film growth rate of approximately 1.2 Angstroms/second. The temperature of crucible 2 is then raised to 1010° C., and a 4000 Angstroms thick layer of single crystal n-GaN is deposited at a film growth rate of approximately 1.0 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 75 mcd when a current of 20 mA was supplied to the device.

EXAMPLE 13

An example illustrating the manufacture of a GaN semiconductor light emitting device by the MBE method using nitrogen triflouride is given below.

In this process a crystal growing apparatus the same as that used in Example 1 is used.

At first a charge of gallium metal is placed in the evaporation crucible 2 and heated to a temperature of around 1000° C., and a charge of Zn is placed in the evaporation crucible 5 and heated to a temperature of around 190° C. Nitrogen triflouride gas is used in the process. This is supplied by the gas cell 7 which is filled with alumina fiber. The ammonia gas is heated to a temperature of 250° C. by the gas cell 7 and directed onto the substrate 9 at a flow rate of 5 cc/minute.

The face shown inclined at 8.1 degrees to the GaAs (001) face towards the (010) face is used for the substrate 11. In this case, one times the atomic spacing forming the line of intersection of the A and C faces of the GaN differs from the GaAs substrate atomic spacing by 2.5%, and four times the C-axis length of the GaN differs from the GaAs substrate atomic spacing by 3.1%.

The vacuum chamber is evacuated to a pressure of $2\times10^{-6}$ Torr for growing the thin film.

First, the substrate 9 is heated and held at a temperature of approximately 620° C. for growing the thin film. To grow the thin film, the shutter of the gallium crucible is opened while supplying a stream of nitrogen triflouride gas from the gas cell 9 to the substrate. As a result, a thin film of multiply oriented crystalline GaN approximately 500 Angstroms thick is deposited on the substrate surface at a film growth rate of approximately 0.6 Angstroms/second. The temperature of crucible 2 is then raised to 980° C., and a 4000 Angstroms thick layer of single crystal n-GaN is deposited at a film growth rate of approximately 0.4 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 25 mcd when a current of 20 mA was supplied to the device.

EXAMPLE 14

An example illustrating the manufacture of a GaN semiconductor light emitting device by the MBE method using nitrogen triflouride is given below.

In this process a crystal growing apparatus the same as that used in Example 1 is used.

At first a charge of gallium metal is placed in the evaporation crucible 2 and heated to a temperature of around 1000° C., and a charge of Zn is placed in the evaporation crucible 5 and heated to a temperature of around 190° C. Nitrogen triflouride gas is used in the process. This is supplied by the gas cell 7 which is filled with alumina fiber. The ammonia gas is heated to a temperature of 250° C. by the gas cell 7 and directed onto the substrate 9 at a flow rate of 5 cc/minute.

The GaP (001) face is used for the substrate 11. In this case, one times the atomic spacing forming the line of intersection of the A and C faces of the GaN differs from the GaP substrate atomic spacing by 0.1%, and four times the C-axis length of the GaN differs from the GaP substrate atomic spacing by 5.3%.

The vacuum chamber is evacuated to a pressure of $2 \times 10^{-6}$ Torr for growing the thin film.

First, the substrate 9 is heated and held at a temperature of approximately 600° C. for growing the thin film. To grow the thin film, the shutter of the gallium crucible is opened while supplying a stream of nitrogen triflouride gas from the gas cell 9 to the substrate. As a result, a thin film of multiply oriented crystalline GaN approximately 700 Angstroms thick is deposited on the substrate surface at a film growth rate of approximately 0.6 Angstroms/second. The temperature of crucible 2 is then raised to 980° C., and a 5000 Angstroms thick layer of single crystal n-GaN is deposited at a film growth rate of approximately 0.4 Angstroms/second. Subsequently, the crucible 2 shutter and the Zn crucible 5 shutter are opened together, and a single crystal p-GaN layer doped with Zn is deposited to a thickness of 500 Angstroms, thereby producing a nitride semiconductor laminated structure.

The laminated thin film was then made into a light emitting device using methods similar to those used for Example 1.

This device gave a blue light emission having a wave length of 470 nm and an intensity of 28 mcd when a current of 20 mA was supplied to the device.

EXAMPLE 15

An example illustrating the manufacture of a $Ga_xIn_{1-x}N$ semiconductor light emitting device by the MBE method using nitrogen triflouride is given below.

In this process a crystal growing apparatus the same as that used in Example 1 is used.

At first a charge of gallium metal is placed in the evaporation crucible 2 and heated to a temperature of around 1000° C., a charge of In is placed in the evaporation crucible 3 and heated to a temperature of around 930° C., and a charge of Zn is placed in the evaporation crucible 5 and heated to a temperature of around 190° C. Nitrogen triflouride gas is used in the process. This is supplied by the gas cell 7 which is filled with alumina fiber. The ammonia gas is heated to a temperature of 200° C. by the gas cell 7 and directed onto the substrate 9 at a flow rate of 5 cc/minute.

The sapphire face shown in FIG. 1 inclined at 9.2 degrees to the R face towards the A face is used for the substrate 9. In this case, four times the atomic spacing forming the line of intersection of the A and C faces of the GaN differs from the sapphire substrate atomic spacing by 1.0%, and three times the C-axis length of the GaN differs from the sapphire substrate atomic spacing by 0.6%.

The vacuum chamber is evacuated to a pressure of $2 \times 10^{-6}$ Torr for growing the thin film.

The substrate 9 is first heated and held at a temperature of approximately 900° C. for 30 minutes. The temperature is then lowered to 700° C. for growing the thin film. To grow the thin film, firstly only the shutter of the gallium crucible is opened while supplying a stream of nitrogen triflouride gas from the gas cell 9 to the substrate. The shutters of the Ga crucible and the In crucible are then opened together. The temperature of the evaporation crucible 3 is then gradually raised from 900° C. to 960° C. at a rate of approximately 1.2° C./minute, and during this time a composite gradient layer approximately 1000 Angstroms thick is formed. This layer comprises multiply oriented crystallization wherein the structure varies from an initial GaN layer to a final $Ga_{0.7}In_{0.3}N$. With the temperature of crucible 2 at around 980° C., and the temperature of the crucible 3 at around 940° C., a 4000 Angstroms thick layer of single crystal n-$Ga_{0.7}In_{0.3}N$ is deposited at a film growth rate of 1.0 Angstroms/second. Subsequently, the crucible 2 shutter and the Zn crucible 5 shutter are opened together, and a single crystal p-$Ga_{0.7}In_{0.3}N$ layer doped with Zn is deposited to a thickness of 500 Angstroms, thereby producing a nitride semiconductor laminated structure.

The laminated thin film was then made into a light emitting device using methods similar to those used for Example 1.

This device gave a green light emission having a wave length of 535 nm and an intensity of 90 mcd when a current of 20 mA was supplied to the device.

EXAMPLE 16

An example illustrating the manufacture of a $Ga_xIn_{1-x}N$ semiconductor light emitting device by the MBE method using nitrogen triflouride is given below.

In this process a crystal growing apparatus the same as that used in Example 1 is used.

At first a charge of gallium metal is placed in the evaporation crucible 2 and heated to a temperature of around 1000° C., a charge of In is placed in the evaporation crucible 3 and heated to a temperature of around 930° C., and a charge of Zn is placed in the evaporation crucible 5 and heated to a temperature of around 220° C. Nitrogen triflouride gas is used in the process. This is supplied by the gas cell 7 which is filled with alumina fiber. The ammonia gas is heated to a temperature of 200° C. by the gas cell 7 and directed onto the substrate 9 at a flow rate of 5 cc/minute.

The sapphire face shown in FIG. 1 inclined at 9.2 degrees to the R face towards the A face is used for the substrate 9. In this case, four times the atomic spacing forming the line of intersection of the A and C faces of the GaN differs from the sapphire substrate atomic spacing by 1.0%, and three times the C-axis length of the GaN differs from the sapphire substrate atomic spacing by 0.6%.

The vacuum chamber is evacuated to a pressure of $2 \times 10^{-6}$ Torr for growing the thin film.

The substrate 9 is first heated and held at a temperature of approximately 900° C. for 30 minutes. The temperature is then lowered to 700° C. for growing the thin film. To grow the thin film, firstly only the shutter of the gallium crucible is opened while supplying a stream of nitrogen triflouride gas from the gas cell 9 to the substrate. The shutters of the Ga crucible and the In crucible are then opened together. The temperature of the evaporation crucible 3 is then gradually raised from 900° C. to 960° C. at a rate of approximately 1.2° C./minute, and during this time a composite gradient layer approximately 1000 Angstroms thick is formed. This layer comprises multiply oriented crystallization wherein the structure varies from an initial GaN layer to a final $Ga_{0.7}In_{0.3}N$. With the temperature of crucible 2 at around 980° C., and the temperature of the crucible 3 at around 940° C., a 2500 Angstroms thick layer of single crystal n-$Ga_{0.7}In_{0.3}N$ is deposited at a film growth rate of 1.0 Angstroms/second. Subsequently, the crucible 2 shutter and the Zn crucible 5 shutter are opened together, and a single crystal i-$Ga_{0.7}In_{0.3}N$ layer doped with Zn is grown to a thickness of 5000 A. Then with the Zn crucible temperature at around 190° C. a single crystal p-$Ga_{0.7}In_{0.3}N$ layer is deposited to give 2000 Angstroms, thereby producing a nitride semiconductor laminated structure.

Figure 19:
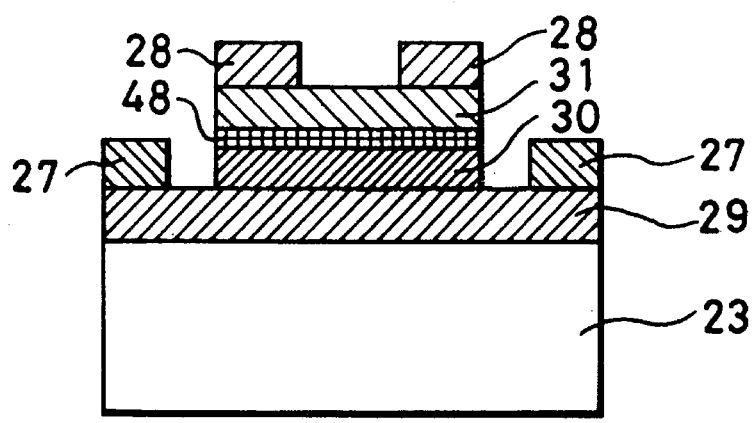
FIG. 19 is a sectional structural view showing a light detecting device comprising oriented polycrystalline $Ga_{1-x}In_xN/n-Ga_{1-x}In_xN/i-Ga_{1-x}In_xN/p-Ga_{1-x}In_xN$.

The laminated thin film was then made into a pin type light detecting device as shown in FIG. 19, using methods similar to those used for Example 1.

This device gave a 6 mA output current with a 20 V applied bias voltage under a 540 nm light illumination of 100 $W/m^2$ intensity.

COMPARATIVE EXAMPLE 1

The follow example illustrates the manufacture of a GaN semiconductor laminated thin film using a quartz reactor tube fitted with a high frequency induction heating coil and carbon susceptor. In this process trimethyl gallium and ammonia gas are fed to the reaction tube using hydrogen as the carrier gas to produce the GaN semiconductor laminated thin film.

A sapphire R face is used for the substrate. This is heated to 1040° C. Trimethyl gallium which has been cooled to −15° C. is then supplied with a hydrogen carrier gas at a flow rate of 40 cc/minute to the reaction tube, together with ammonia gas at 1000 cc/minute with 1500 cc/minute of hydrogen as a carrier gas. As a result a 10 micron thick layer of n-GaN semiconductor is grown on the substrate at a growth rate of 0.2 microns/minute. Di-ethyl zinc which has been heated to 45° C. is then fed to the reaction tube at a flow rate of 20 cc/minute using hydrogen gas as the carrier gas, together with the beforementioned gas, and an i-GaN semiconductor thin film doped with zinc is deposited to a thickness of 1 micron, thereby producing a nitride semiconductor laminated structure.

The laminated thin film was then made into a light emitting device using methods similar to those used for Example 1. In this case however, to form the terminal it was necessary to remove more than 5 microns of GaN semiconductor thin film by etching, and since the ion milling with argon took more than three hours the operation was impractical.

This device gave a blue light emission having a wave length of 480 nm and intensity of 18 mcd when a current of 20 mA was supplied to the device. However, the light emission in the device surface was not uniform, and the device durability was poor such that after several minutes, the light intensity decreased by several mcd.

COMPARATIVE EXAMPLE 2

In this example, apart from using the sapphire C face as the substrate, the procedures for manufacturing the GaN semiconductor laminated structure were the same as for Example 1.

In this case, the mismatch of the GaN C-face lattice constant and the sapphire C-face lattice constant was 13.8%.

Although the GaN thin film grown on the sapphire C-face had a film thickness of more than 5000 Angstroms it was in a polycrystalline condition with surface undulations and island growth so that a light emitting device could not be produced.

COMPARATIVE EXAMPLE 3

In this example, apart from using the sapphire (11 $\bar{2}$ 5) face as the substrate, the procedures for manufacturing the GaN semiconductor laminated structure were the same as for Example 1.

In this case, there was a mismatch of 33.2% between the atomic spacing along the line of intersection of the A and C faces of the GaN, and the sapphire substrate atomic spacing, and a mismatch of 26.7% between the C-axis length of the GaN, and the sapphire substrate atomic spacing.

Although the GaN thin film grown on the sapphire (11 $\bar{2}$ 5) face had a film thickness of more than 5000 Angstroms it was in a polycrystalline condition with surface undulations and island growth so that a light emitting device could not be produced.

COMPARATIVE EXAMPLE 4

In this example, apart from using a substrate with a face inclined at 12.4 degrees to the sapphire (10 $\bar{1}$ 0) face towards the C face as the substrate, the procedures for manufacturing the GaN semiconductor laminated structure were the same as for Example 1.

In this case, there was a mismatch of 33.2% between the atomic spacing along the line of intersection of the A and C faces of the GaN, and the sapphire substrate atomic spacing, and a mismatch of 0.9% between thirteen times the C-axis length of the GaN, and the sapphire substrate atomic spacing.

Surface undulations were apparent on the first layer and the thin film of n-GaN and i-GaN showed poor uniformity.

This device gave a blue light emission having a wave length of 470 nm and an intensity of 10 mcd when a current of 20 mA was supplied to the device. However, the light emitting portion was not uniform, and current leakage was evident.

COMPARATIVE EXAMPLE 5

In this example, apart from having a GaN semiconductor growth rate of 150 Angstroms/second, the procedures for manufacturing the GaN semiconductor laminated structure were the same as for Example 1.

Although the first layer had a thickness of more than 5000 Angstroms it was in a polycrystalline condition with surface undulations and island growth so that a light emitting device could not be produced.

INDUSTRIAL APPLICABILITY

The nitride semiconductor light emitting device according to the present invention, has an extremely thin film grown on a specific substrate surface with good surface flatness and crystallization. Consequently, device manufacturing processes are simplified and high reliability is possible. An device may be produced which produces a blue light emission when a current is applied. Furthermore, since the film thickness is small, the process for manufacture of light emitting devices is simplified and high reliability is possible. Moreover, the efficiency of light removal may also be increased.

What is claimed is:

1. A nitride semiconductor device comprising:

a substrate;

a first layer of an oriented polycrystalline nitride semiconductor of less than 5000 Angstroms thickness disposed directly on said substrate;

an operating layer of a single crystal nitride semiconductor disposed directly on said first layer; and at least two electrical terminals connected at predetermined locations, at least one of said terminals being connected directly to said first layer.

2. The nitride semiconductor device as claimed in claim 1, wherein at least one of the orientations of the periodic arrangement of the atoms on the surface of said substrate, and at least one of the orientations of the crystal axes of the lattice face of said first layer nitride semiconductor in direct contact with said substrate coincide, and the mismatch of an integer multiple (from 1 to 10) of the atomic spacing of the latter orientation and the atomic spacing of the former orientation is within 5%.

3. The nitride semiconductor device as claimed in claim 2, wherein said substrate is a transparent single crystal substrate having a transmissivity in the 360 to 800 nm wave length region of at least 80%.

4. The nitride semiconductor device as claimed in claim 3, wherein said transparent single crystal substrate is a sapphire substrate.

5. The nitride semiconductor device as claimed in claim 4, wherein a face of said transparent single crystal substrate is the sapphire (01 $\bar{1}$ 2) R face.

6. The nitride semiconductor device as claimed in claim 5, wherein a face of said transparent single crystal substrate is inclined at an angle of 9.2 degrees to the sapphire (01 $\bar{1}$ 2) R face towards the ($\bar{2}$ 110) A face.

7. The nitride semiconductor device as claimed in claim 1, wherein said single crystal nitride semiconductor comprises nitrogen and at least one Group III constituent selected from aluminum, gallium, and indium.

8. The nitride semiconductor device as claimed in claim 1, wherein the C axis orientation of a crystal axis of the oriented polycrystalline nitride semiconductor of the first layer is parallel to the substrate surface.

9. The nitride semiconductor device as claimed in claim 1, wherein said first layer of an oriented polycrystalline nitride semiconductor has a composition graded structure, with the structure changing gradually from the portion in contact with the substrate to the portion in contact with the operating layer to finally give a required operating layer composition.

10. The nitride semiconductor device as claimed in claim 1, wherein said first layer of an oriented polycrystalline nitride semiconductor has a laminated structure of alternate differing composition nitride semiconductor layers each of less than 100 Angstroms thickness.

11. The nitride semiconductor device as claimed in claim 1, wherein said first layer of an oriented polycrystalline nitride semiconductor is doped with n-type dopant.

12. The nitride semiconductor device as claimed in claim 1, wherein said single crystal nitride semiconductor operating layer comprises a layer having a combination of at least two single crystal nitride semiconductors selected from the group of p-type, i-type and n-type single crystal nitride semiconductors.

13. The nitride semiconductor device as claimed in claim 1, wherein said single crystal nitride semiconductor operating layer comprises at least two layers having a combination of at least two single crystal nitride semiconductors selected from the group of p-type, i-type and n-type single crystal nitride semiconductors.

14. The nitride semiconductor device as claimed in claim 12 or claim 13, wherein a thickness of said single crystal nitride semiconductor operating layer is not more than 5 microns.

15. The nitride semiconductor device as claimed in claim 14, wherein said single crystal nitride semiconductor operating layer comprises at least one layer of p-type, i-type and n-type single crystal nitride semiconductor, and a terminal for applying a voltage is connected to said p-type or i-type single crystal nitride semiconductor layer.

16. The nitride semiconductor device as claimed in claim 15, wherein a surface layer is made from said p-type or i-type single crystal nitride semiconductor, and a terminal having a pattern for uniformly applying a voltage to produce a light, is disposed over a region of said surface layer not exceeding 50% of the area thereof.

17. The nitride semiconductor device as claimed in claim 14, wherein said single crystal nitride semiconductor operating layer comprises an i-type single crystal nitride semiconductor having a thickness of not more than 500 angstroms, an n-type single crystal nitride semiconductor having a thickness of not more than 3 microns, and a terminal for applying a voltage is disposed on said i-type single crystal nitride semiconductor layer.

18. The nitride semiconductor device as claimed in claim 14, wherein said single crystal nitride semiconductor operating layer comprises at least a p-type single crystal nitride semiconductor having a thickness of not more than 2 microns, and an n-type single crystal nitride semiconductor having a thickness of not more than 3 microns, and a terminal for applying a voltage is disposed on said p-type single crystal nitride semiconductor layer.

19. The nitride semiconductor device as claimed in claim 14, wherein said single crystal nitride semiconductor operating layer comprises at least a p-type single crystal nitride semiconductor, an i-type single crystal nitride semiconductor, and an n-type single crystal nitride semiconductor, and a terminal for applying a voltage is disposed on said p-type single crystal nitride semiconductor layer, wherein a current is produced in said operating layer when said operating layer is illuminated with light.

20. A method of making a nitride semiconductor device using a molecular beam epitaxy crystal growth apparatus having a gas source for supplying a compound including nitrogen in a gaseous state, a solid body source for supplying Group III constituents, and a source for supplying n-type and p-type dopants, comprising the steps of:

supplying a gaseous state compound containing nitrogen, and a Group III constituent to the surface of a substrate, with said substrate at a temperature of 300° to 1000° C., under a pressure of less than $10^{-5}$ Torr to produce a first layer of an oriented polycrystalline nitride semiconductor on said substrate at a growth rate of 0.1 to 20 Angstroms/second;

supplying a gaseous state compound containing nitrogen, and a Group III constituent to the surface of said first layer with said substrate at a temperature of 300 to 1000° C., under a pressure of less than $10^{-5}$ Torr to produce a single nitride semiconductor layer on said first layer at a growth rate of 0.1 to 10 Angstroms/second;

dry etching predetermined positions on an operating layer comprising at least one of a p-type and an i-type single crystal nitride semiconductor, and an n-type single crystal nitride semiconductor, and predetermined positions on said first layer;

heat treating the device after the dry etching step at a temperature below at least one of the temperature of dissociation of the nitrogen containing gas and the temperature of dissociation of the nitride semiconductor, in at least one of an inert gas and other gases; and forming terminals on at least two of the predetermined positions of said operating layer, at least one of said terminals being connected directly to said first layer.

21. The method of making a nitride semiconductor device as claimed in claim 20, wherein ammonia, nitrogen triflouride, hydrazine or di methyl hydrazine is used as the compound containing nitrogen.

22. The method of making a nitride semiconductor device according to claim 20, wherein said compound containing nitrogen gas is heated and supplied to the surface of said substrate.

23. The method of making a nitride semiconductor device as claimed in claim 20, wherein nitrogen containing ammonia is used as the compound containing nitrogen, and these are supplied in a plasma gaseous state.

24. The method of making a nitride semiconductor device according to claim 20, wherein a partial pressure of a carbon containing compound inside the crystal growth apparatus is less than $10^{-8}$ Torr.

* * * * *